(12) United States Patent
Kim et al.

(10) Patent No.: US 11,683,970 B2
(45) Date of Patent: Jun. 20, 2023

(54) DISPLAY DEVICE

(71) Applicant: SAMSUNG DISPLAY CO., LTD., Yongin-si (KR)

(72) Inventors: Hyunyoung Kim, Asan-si (KR); Jong-Ryuk Park, Cheonan-si (KR); Gyeongnam Bang, Seoul (KR); Kwangsik Lee, Cheonan-si (KR); Jiyoun Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 29 days.

(21) Appl. No.: 17/324,505

(22) Filed: May 19, 2021

(65) Prior Publication Data
US 2021/0367000 A1    Nov. 25, 2021

(30) Foreign Application Priority Data

May 20, 2020  (KR) .......................... 10-2020-0060182

(51) Int. Cl.
*G06F 3/041* (2006.01)
*G06F 3/044* (2006.01)
(Continued)

(52) U.S. Cl.
CPC .......... *H01L 27/323* (2013.01); *G06F 3/0412* (2013.01); *G06F 3/0446* (2019.05);
(Continued)

(58) Field of Classification Search
CPC .............. H01L 27/323; H01L 27/3223; H01L 27/3244; H01L 27/3258; H01L 22/34;
(Continued)

(56) References Cited

U.S. PATENT DOCUMENTS 9,183,774 B2    11/2015  Park et al.
10,665,620 B2    5/2020  Park et al.
(Continued)

FOREIGN PATENT DOCUMENTS

CN    109901747    6/2019
CN    110648618    1/2020
(Continued)

*Primary Examiner* — Hong Zhou
(74) *Attorney, Agent, or Firm* — F. Chau & Associates, LLC

(57) ABSTRACT

A display device includes a display panel including a hole area, a display area around the hole area, and a non-display area around the display area, a first-first insulating layer disposed in the hole area, sensing electrodes disposed on the display area, a crack detection pattern disposed on the first-first insulating layer in the hole area, a crack detection line disposed on the non-display area, and a connection pattern disposed in a first sensing electrode of the sensing electrodes disposed on the display area to be insulated from the sensing electrodes, and connected to the crack detection pattern and the crack detection line, the first sensing electrode being disposed between the hole area and the non-display area. An edge of the first-first insulating layer disposed at a boundary between the display area and the hole area has a step structure of at least two steps.

22 Claims, 25 Drawing Sheets

(51) Int. Cl.
*H01L 27/32* (2006.01)
*H01L 51/00* (2006.01)
*H01L 51/52* (2006.01)

(52) U.S. Cl.
CPC ...... *H01L 27/3223* (2013.01); *H01L 27/3244* (2013.01); *H01L 51/0097* (2013.01); *H01L 51/5253* (2013.01)

(58) Field of Classification Search
CPC ............. H01L 27/3225; H01L 51/0097; H01L 51/5253; H01L 51/5246; G06F 3/0412; G06F 3/0446; G06F 2203/04111; G06F 2203/04112; G06F 3/04164
See application file for complete search history.

(56) References Cited

U.S. PATENT DOCUMENTS

| | | | |
|---|---|---|---|
| 10,868,102 B1* | 12/2020 | Zhang | ................. H01L 51/5246 |
| 2016/0307971 A1 | 10/2016 | Jeon | |
| 2018/0033355 A1 | 2/2018 | Lee et al. | |
| 2019/0019441 A1 | 1/2019 | Shin et al. | |
| 2019/0198598 A1* | 6/2019 | Lee | ........................ H01L 27/124 |
| 2019/0334120 A1 | 10/2019 | Seo et al. | |
| 2020/0136087 A1 | 4/2020 | Kim et al. | |
| 2020/0173949 A1 | 6/2020 | Lee et al. | |
| 2020/0194721 A1* | 6/2020 | Lee | ........................ G06F 3/0412 |
| 2020/0273919 A1 | 8/2020 | Ding et al. | |
| 2021/0096697 A1* | 4/2021 | Do | ........................ G06F 3/0448 |
| 2022/0003810 A1 | 1/2022 | Ye | |

FOREIGN PATENT DOCUMENTS

| | | |
|---|---|---|
| EP | 3783465 | 2/2021 |
| KR | 10-2018-0035288 | 4/2018 |
| KR | 10-2018-0049296 | 5/2018 |
| KR | 10-1921079 | 11/2018 |
| KR | 10-2019-0007570 | 1/2019 |
| KR | 10-2019-0116786 | 10/2019 |
| KR | 10-2019-0126016 | 11/2019 |
| KR | 10-2020-0066445 | 6/2020 |
| WO | 2020080740 | 4/2020 |

* cited by examiner

DISPLAY DEVICE

CROSS-REFERENCE TO RELATED APPLICATION

This U.S. non-provisional patent application claims priority under 35 U.S.C. § 119 of Korean Patent Application No. 10-2020-0060182, filed on May 20, 2020, the entire contents of which are hereby incorporated by reference.

BACKGROUND

The present disclosure herein relates to a display device, more particularly to a display device with a crack detection pattern.

An electronic device such as a smartphone, a digital camera, a laptop computer, a navigation device and a smart TV, which generally provides an image to a user, includes a display device for displaying an image. The display device generates an image and provides the generated image to a user through a display screen.

The display device includes a display panel for generating an image, an input sensing part disposed on the display panel to sense an external input, and functional elements for providing various functions to a user. The input sensing part includes a plurality of sensing electrodes for sensing an external input. The functional elements include a speaker, a camera, a sensor and the like. A plurality of holes are defined in the display panel and the input sensing unit, and the functional elements are disposed in the holes.

SUMMARY

The present disclosure provides a display device with improved reliability.

According to an exemplary embodiment of the present inventive concept, a display device includes a display panel including a hole area, a display area around the hole area, and a non-display area around the display area, a first-first insulating layer disposed in the hole area, a plurality of sensing electrodes disposed on the display area, a crack detection pattern disposed on the first-first insulating layer in the hole area, a crack detection line disposed on the non-display area, and a connection pattern disposed in a first sensing electrode of the plurality of sensing electrodes disposed on the display area to be insulated from the plurality of sensing electrodes, and connected to the crack detection pattern and the crack detection line, the first sensing electrode being disposed between the hole area and the non-display area. An edge of the first-first insulating layer disposed at a boundary between the display area and the hole area has a step structure of at least two steps.

According to an exemplary embodiment of the present inventive concept, a display device includes a display panel including a first area, a second area around the first area, and a third area around the second area, an insulating layer disposed in the first area, a plurality of sensing electrodes disposed on the second area, and a crack detection part which is disposed on the insulating layer in the first area, is insulated from the plurality of sensing electrodes, and extends to the second area and the third area. An edge of the insulating layer disposed at a boundary between the first area and the second area has a step structure of at least two steps.

According to an exemplary embodiment of the present inventive concept, a display device includes a display panel including a first area, a second area around the first area, and a third area around the second area, an insulating layer disposed in the first area, a plurality of sensing electrodes disposed on the second area, a crack detection pattern disposed on the insulating layer in the first area, a crack detection line disposed on the third area, a connection pattern disposed in a first sensing electrode of the plurality of sensing electrodes disposed on the second area to be insulated from the plurality of sensing electrodes, and configured to connect the crack detection pattern and the crack detection line, wherein the first sensing electrode is disposed between the first area and the third area, and a capping layer disposed on the insulating layer to cover an edge of the insulating layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings.

DETAILED DESCRIPTION

Figure 1:
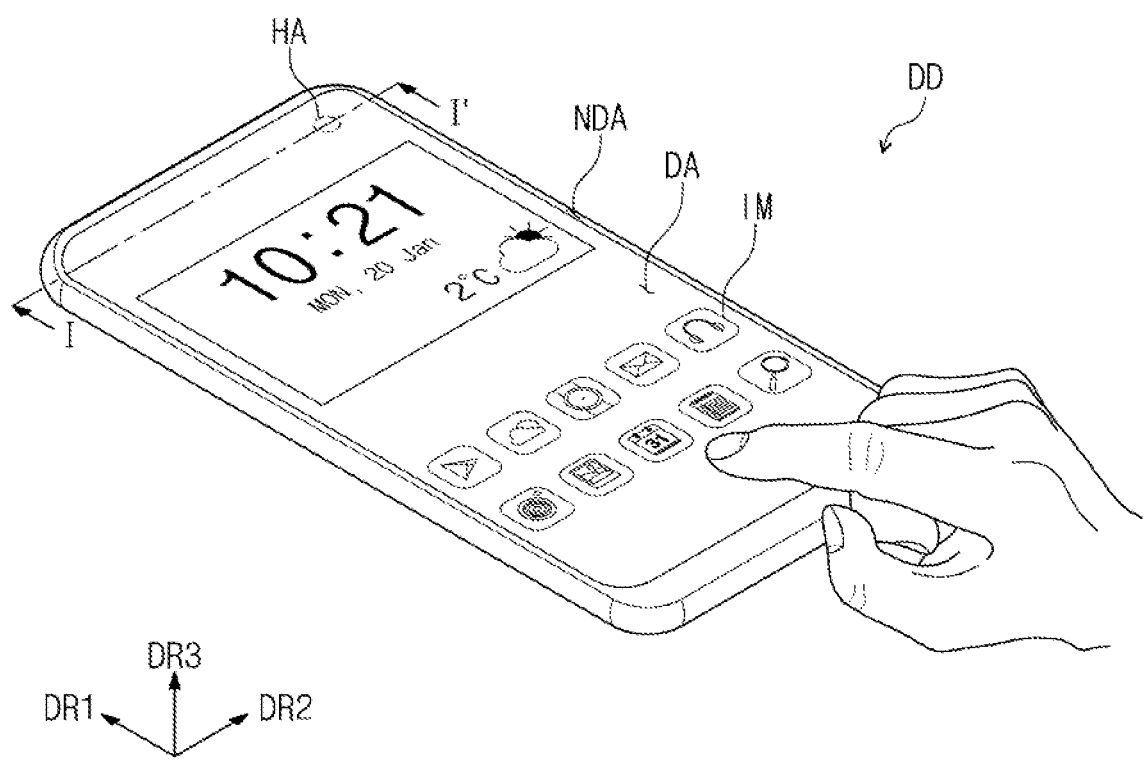
FIG. 1 is a perspective view of a display device according to an exemplary embodiment of the present inventive concept.

It will be understood that when an element or layer is referred to as being "on", "connected to" or "coupled to" another element or layer, it may be directly on, connected or coupled to the other element or layer, or intervening elements or layers may be present.

Like reference numerals refer to like elements throughout this specification. In the figures, the thicknesses, ratios and dimensions of elements are exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below may be termed as a second element, component, region, layer or section without departing from the teachings of the present invention. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" or "have", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in detail with reference to the accompanying drawings.

FIG. 1 is a perspective view of a display device according to an embodiment of the inventive concept.

Referring to FIG. 1, a display device DD may include a hole area HA, a display area DA disposed around the hole area HA, and a non-display area NDA around the display area DA. The hole area HA may be defined as a first area, the display area DA may be defined as a second area, and the non-display area NDA may be defined as a third area.

The display area DA may surround the hole area HA, and the non-display area NDA may surround the display area DA. The display area DA may display an image, and the non-display area NDA may not display an image. The non-display area NDA may define an edge of the display device DD. In an exemplary embodiment, the edge of the display device DD may be printed in a predetermined color in a manufacturing process of the display device.

A camera as a functional element may be disposed in the hole area HA. The camera will be illustrated in FIG. 3 below. The hole area HA may be exemplarily disposed in a portion of the display area DA adjacent to an upper end and a right side (e.g., an upper right corner) of the display device DD, but the position of the hole area HA is not limited thereto.

The display device DD may have a rectangular shape having long sides extending in a first direction DR1 and short sides extending in a second direction DR2 crossing the first direction DR1. However, the display device DD is not limited thereto and may have various shapes such as a circle and a polygon. A vertex of the rectangular shape of the display device DD may be formed as a curve.

Hereinafter, a direction substantially orthogonal to a plane defined by the first and second directions DR1 and DR2 is defined as a third direction DR3. In this specification, "when viewed in a plane" may mean a state of being viewed in the third direction DR3.

A top surface of the display device DD may be defined as a display surface and may have a plane defined by the first direction DR1 and the second direction DR2. An image generated in the display device DD may be provided to a user through the display surface. When a user touches icon images IM displayed on the display surface, main images respectively corresponding to the icon images may be provided to the user.

In FIG. 1, the display device DD is exemplarily illustrated as a mobile phone. However, the display device DD may be used in small- and medium-sized electronic devices such as a personal computer, a laptop computer, a car navigation device, a game machine, and a tablet computer, as well as large-sized electronic devices such as a television and an outdoor digital signage. Furthermore, these are presented merely as embodiments, and the display device DD may also be employed in other electronic devices as long as the same does not depart from the inventive concept.

Figure 2:
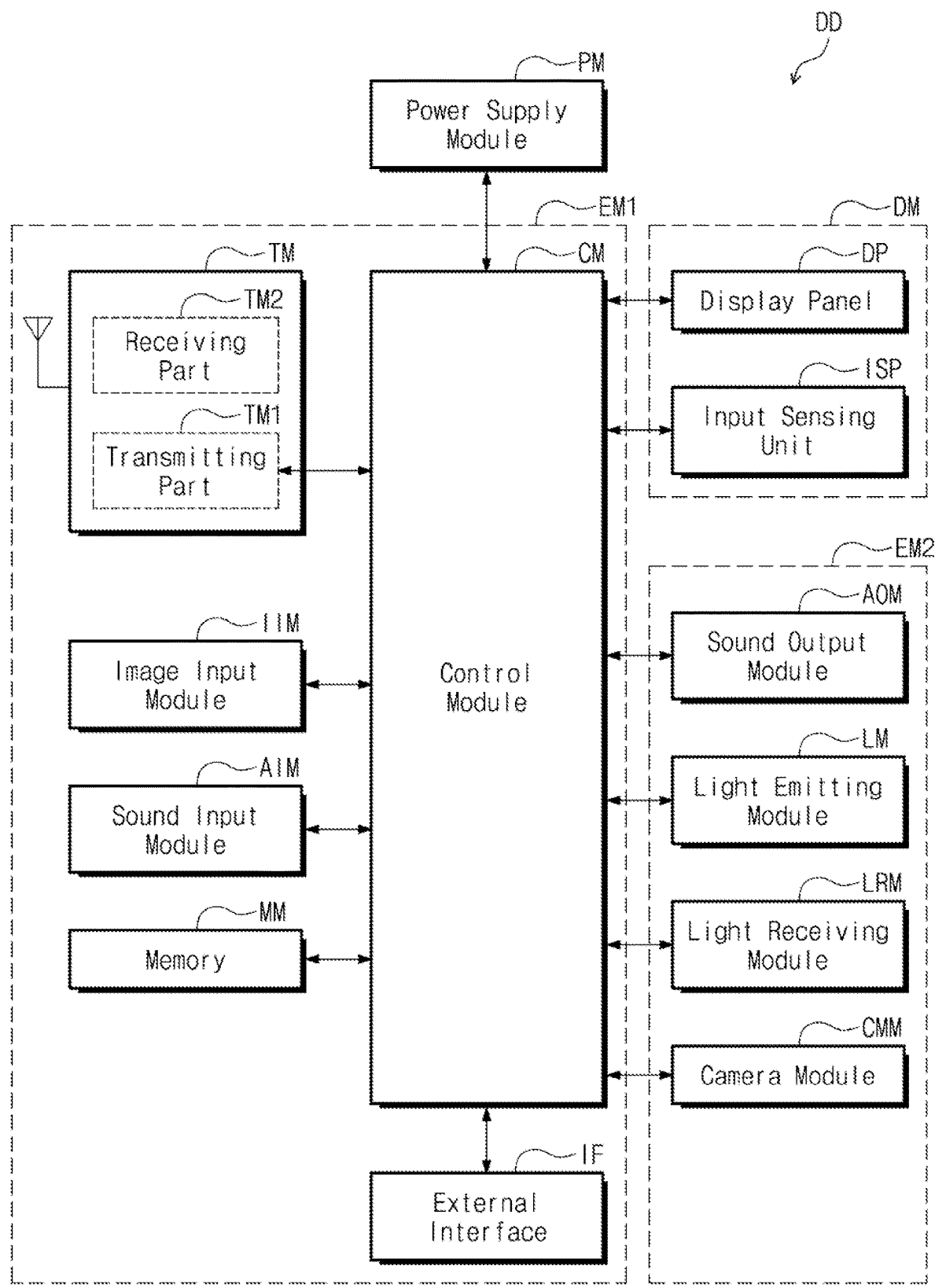
FIG. 2 is a block diagram of the display device illustrated in FIG. 1 according to an exemplary embodiment of the present inventive concept.

FIG. 2 is a block diagram of the display device illustrated in FIG. 1.

Referring to FIG. 2, the display device DD according to an embodiment of the inventive concept may include a display module DM, a power supply module PM, a first electronic module EM1, and a second electronic module EM2. The display module DM, the power supply module PM, the first electronic module EM1, and the second electronic module EM2 may be electrically connected to each other.

The power supply module PM may supply power required for an overall operation of the display device DD. The power supply module PM may include a battery module.

The first electronic module EM1 and the second electronic module EM2 may include various functional modules for operating the display device DD. The first electronic module EM1 may be mounted directly on a main board electrically connected to the display module DM or may be mounted on a separate board to be electrically connected to the main board through a connector (not illustrated) or the like.

The first electronic module EM1 may include a control module CM, a wireless communication module TM, an image input module IIM, a sound input module AIM, memory MM, and an external interface IF. Some of the modules described above may not be mounted on the main board, but may be electrically connected to the main board through a flexible circuit board.

The control module CM may control the overall operation of the display device DD. The control module CM may activate or deactivate the display module DM. The control module CM may control other modules such as the image input module IIM and the sound input module AIM on the basis of a touch signal received from the display module DM.

The wireless communication module TM may transmit/receive a radio signal to/from another terminal by using a Bluetooth or Wi-Fi channel. The wireless communication module TM may transmit/receive a voice signal by using a general communication channel. The wireless communication module TM may include a transmitting part TM1 for modulating a signal to be transmitted and transmitting the modulated signal, and a receiving part TM2 for demodulating a received signal.

The image input module IIM may process an image signal to convert the processed image signal into image data that may be displayed on the display module DM. The sound input module AIM may receive an external sound signal by using a microphone in a recording mode, a voice recognition mode or the like, and may convert the received external sound signal into electrical voice data.

The external interface IF may serve as an interface which is connected to an external charger, a wired/wireless data port, a card socket (e.g., a memory card and a SIM/UIM card), or the like.

The second electronic module EM2 may include a sound output module AOM, a light emitting module LM, a light receiving module LRM, a camera module CMM, or the like. The elements described above may be mounted directly on the main board, may be mounted on a separate board to be electrically connected to the display module DM via a connector (not illustrated) or the like, or may be electrically connected to the first electronic module EM1.

The sound output module AOM may convert sound data received from the wireless communication module TM or stored in the memory MM and output the converted sound data to the outside. The light emitting module LM may generate and output light. The light emitting module LM may output infrared rays. The light emitting module LM may include an LED element. The light receiving module LRM may sense infrared rays. The light receiving module LRM may be activated when infrared rays having an intensity at a predetermined level or higher level are sensed. The light receiving module LRM may include a CMOS sensor.

After infrared rays generated in the light emitting module LM are outputted, the infrared rays may be reflected by an external object (e.g., a user's finger or face), and the reflected infrared rays may be incident on the light receiving module LRM. The camera module CMM may include a camera disposed in the hole area HA to capture an external image.

The display module DM may include a display panel DP and an input sensing part ISP. The display panel DP may display an image using image data provided from the control module CM.

The input sensing part ISP may sense an external input (e.g., a user's hand or a touch pen), and the sensing signal may be converted into an input signal to be transmitted to the control module CM. The input sensing part ISP may sense the external input in a capacitive method. The control module CM may control an operation of the display panel DP in response to the input signal from the input sensing part ISP.

Figure 3:
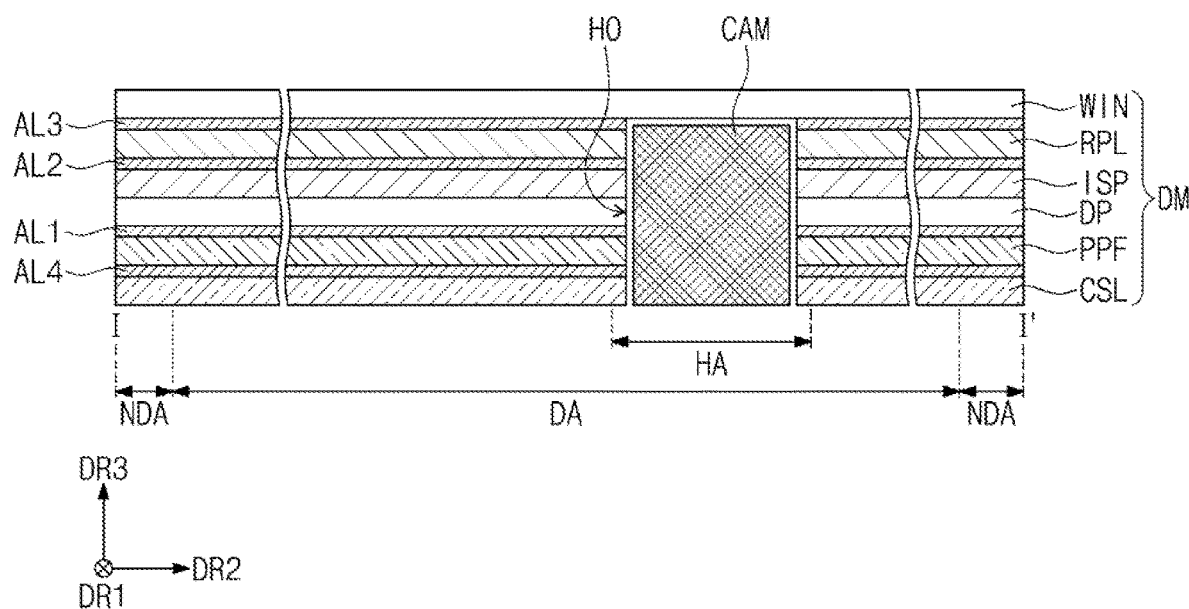
FIG. 3 is a cross-sectional view taken along line I-I' illustrated in FIG. 1 according to an exemplary embodiment of the present inventive concept.

FIG. 3 is a cross-sectional view taken along line I-I' illustrated in FIG. 1.

Referring to FIG. 3, the display module DM of the display device DD may include the display panel DP, the input sensing part ISP, an anti-reflection layer RPL, a window WIN, a panel protective film PPF, a cushion layer CSL, and first to fourth adhesive layers AL1 to AL4. The input sensing part ISP, the anti-reflection layer RPL, and the window WIN may be disposed on the display panel DP. The panel protective film PPF and the cushion layer CSL may be disposed below the display panel DP.

The display module DM may include a hole area HA, a display area DA, and a non-display area NDA, as illustrated in FIG. 1. A hole HO may be defined in the hole area HA. The hole area HA may be defined around the hole HO. The hole HO may be defined in the anti-reflection layer RPL, the input sensing part ISP, the display panel DP, the panel protective film PPF, the cushion layer CSL, and the first to fourth adhesive layers AL1 to AL4. A camera CAM may be disposed in the hole HO. In an exemplary embodiment, the hole HO may penetrate the anti-reflection layer RPL, the input sensing part ISP, the display panel DP, the panel protective film PPF, the cushion layer CSL, and the first to fourth adhesive layers AL1 to AL4. The window WIN may cover the hole HO, and the camera CAM may be disposed in the hole HO beneath the window WIN.

The display panel DP may be a flexible display panel. In addition, the display panel DP according to an embodiment of the inventive concept may be a light emitting display panel and is not particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot, a quantum rod or the like. Hereinafter, the display panel DP is described as an organic light emitting display panel.

The input sensing part ISP may be disposed on the display panel DP. The input sensing part ISP may include a plurality of sensors (not illustrated) for sensing an external input. The sensors may sense the external input in a capacitive method. The input sensing part ISP may be manufactured directly on the display panel DP when the display panel DP is manufactured. However, the input sensing part ISP is not limited thereto and may be manufactured as a panel separate from the display panel DP to be attached to the display panel DP by an adhesive layer.

The anti-reflection layer RPL may be disposed on the input sensing part ISP. The anti-reflection layer RPL may be defined as a film preventing reflection of external light. The anti-reflection layer RPL may reduce the degree of reflection of external light incident on the display panel DP from above the display device DD. For example, the anti-reflection layer RPL may include a phase retarder and/or a polarizer.

The window WIN may be disposed on the anti-reflection layer RPL. The window WIN may protect the display panel DP, the input sensing part ISP, and the anti-reflection layer RPL from external scratches and/or impact. The window WIN may be optically transparent. External light may be provided to the camera CAM through the window WIN.

The panel protective film PPF may be disposed below the display panel DP. The panel protective film PPF may be defined as a protective substrate. The panel protective film PPF may protect a lower portion of the display panel DP. The panel protective film PPF may include a flexible plastic material. For example, the panel protective film PPF may include polyethylene terephthalate (PET).

The cushion layer CSL may be disposed below the panel protective film PPF. The cushion layer CSL may protect the display panel DP by absorbing external impact applied to a lower portion of the display module DM. The cushion layer CSL may include a foam sheet having a predetermined elastic force.

The first adhesive layer AL1 may be disposed between the display panel DP and the panel protective film PPF. The display panel DP and the panel protective film PPF may be bonded to each other by the first adhesive layer AL1. The second adhesive layer AL2 may be disposed between the anti-reflection layer RPL and the input sensing part ISP. The anti-reflection layer RPL and the input sensing part ISP may be bonded to each other by the second adhesive layer AL2.

The third adhesive layer AL3 may be disposed between the window WIN and the anti-reflection layer RPL. The window WIN and the anti-reflection layer RPL may be bonded to each other by the third adhesive layer AL3. The fourth adhesive layer AL4 may be disposed between the panel protective film PPF and the cushion layer CSL. The panel protective film PPF and the cushion layer CSL may be bonded to each other by the fourth adhesive layer AL4.

Figure 4:
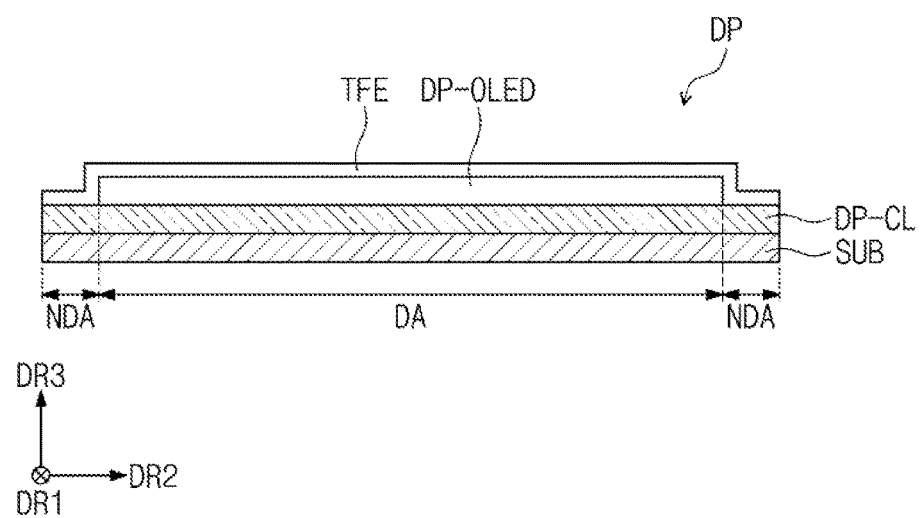
FIG. 4 exemplarily illustrates a cross section of the display panel illustrated in FIG. 3 according to an exemplary embodiment of the present inventive concept.

FIG. 4 exemplarily illustrates a cross section of the display panel illustrated in FIG. 3.

Referring to FIG. 4, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display area DA and a non-display area NDA around the display area DA. The substrate SUB may include a flexible plastic material. For example, the substrate SUB may include polyimide (PI). Although not illustrated, the hole HO illustrated in FIG. 3 may be defined in the substrate SUB, the circuit element layer DP-CL, and the display element layer DP-OLED. In an exemplary embodiment, the hole HO may penetrate the substrate SUB, the circuit element layer DP-CL, and the display element layer DP-OLED.

The display element layer DP-OLED may be disposed on the display area DA. The thin film encapsulation layer TFE may be disposed on the circuit element layer DP-CL to cover the display element layer DP-OLED.

A plurality of pixels may be disposed in the circuit element layer DP-CL and the display element layer DP-OLED. Each of the pixels may include a transistor disposed in the circuit element layer DP-CL and a light emitting element disposed in the display element layer DP-OLED to be connected to the transistor. The configuration of the pixel will be described in detail below.

Figure 5:
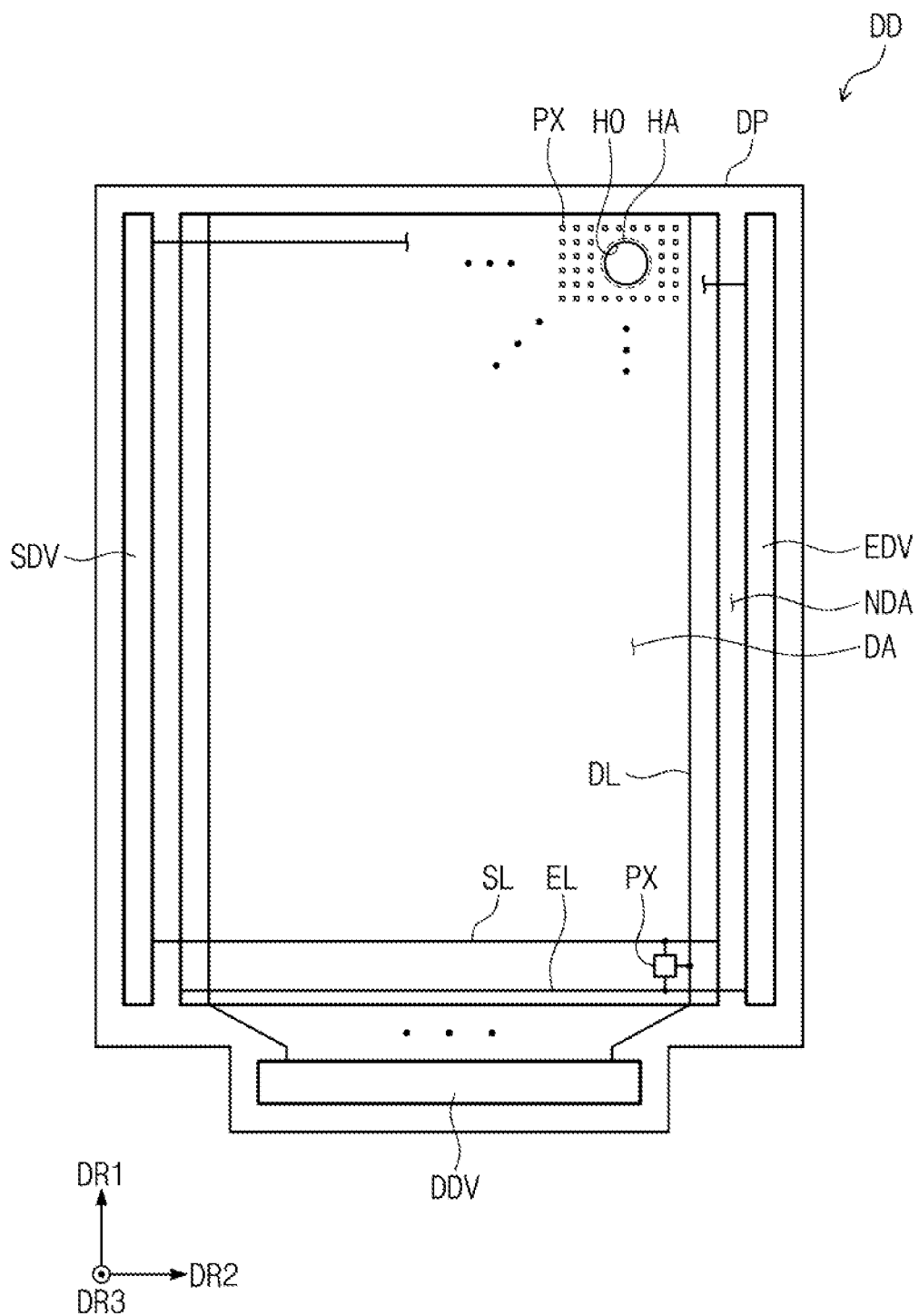
FIG. 5 is a plan view of the display panel illustrated in FIG. 4 according to an exemplary embodiment of the present inventive concept.

FIG. 5 is a plan view of the display panel illustrated in FIG. 4.

Referring to FIG. 5, the display device DD according to an embodiment of the inventive concept may include the display panel DP, a scan driver SDV, a data driver DDV, and an emission driver EDV. The scan driver SDV, the data driver DDV, and the emission driver EDV may be disposed in the display panel DP.

The display panel DP may have long sides extending in the first direction DR1 and short sides extending in the second direction DR2. The display panel DP may include the hole area HA in which the hole HO is defined, a display area DA surrounding the hole area HA, and a non-display area NDA surrounding the display area DA. The hole area HA may correspond to a cut-out region of at least one of a plurality of sensing electrodes SE1 and SE2, which will be described later with reference to FIGS. 8 and 9, disposed in the display area DA to form the hole HO, and a crack detection pattern CDP and a bypass line ARL extending around the hole HO. The crack detection pattern CDP and the by bypass line ARL will be described later with reference to FIG. 9. In an exemplary embodiment of FIG. 9, to form the hole area HA, one first sensing electrode may be cut out and four sensing electrodes surrounding the first sensing electrode are partially cut out. In an exemplary embodiment, the plurality of pixels PX may not be disposed in the hole area HA, and may surround the hole area HA in the display area DA.

The display panel DP may include a plurality of pixels PX, a plurality of scan lines SL, a plurality of data lines DL, and a plurality of emission lines EL. The pixels PX may be disposed in the display area DA and may be connected to the scan lines SL, the data lines DL, and the emission lines EL. The pixels PX may be disposed around the hole area HA. The pixels PX may not be disposed in the hole area HA.

The scan driver SDV, the data driver DDV, and the emission driver EDV may be disposed in the non-display area NDA. The scan driver SDV and the emission driver EDV may be disposed to be respectively adjacent to the long sides of the display panel DP. The data driver DDV may be manufactured in the form of an integrated circuit chip to be disposed adjacent to one of the short sides of the display panel DP.

The scan lines SL may extend in the second direction DR2 to be connected to the scan driver SDV. The data lines DL may extend in the first direction DR1 to be connected to the data driver DDV. The emission lines EL may extend in the second direction DR2 to be connected to the emission driver EDV.

The scan driver SDV may generate a plurality of scan signals, and the scan signals may be applied to the pixels PX through the scan lines SL. The scan signals may be sequentially applied to the pixels PX. The data driver DDV may generate a plurality of data voltages, and the data voltages may be applied to the pixels PX through the data lines DL. The emission driver EDV may generate a plurality of emission signals, and the emission signals may be applied to the pixels PX through the emission lines EL.

Although not illustrated, a timing controller (not illustrated) for controlling operations of the scan driver SDV, the data driver DDV, and the emission driver EDV may be included in the display device DD.

The pixels PX may receive the data voltages in response to the scan signals. The pixels PX may display an image by emitting light of luminance corresponding to the data voltages in response to the emission signals. The emission time of the pixels PX may be controlled by the emission signals.

Figure 6:
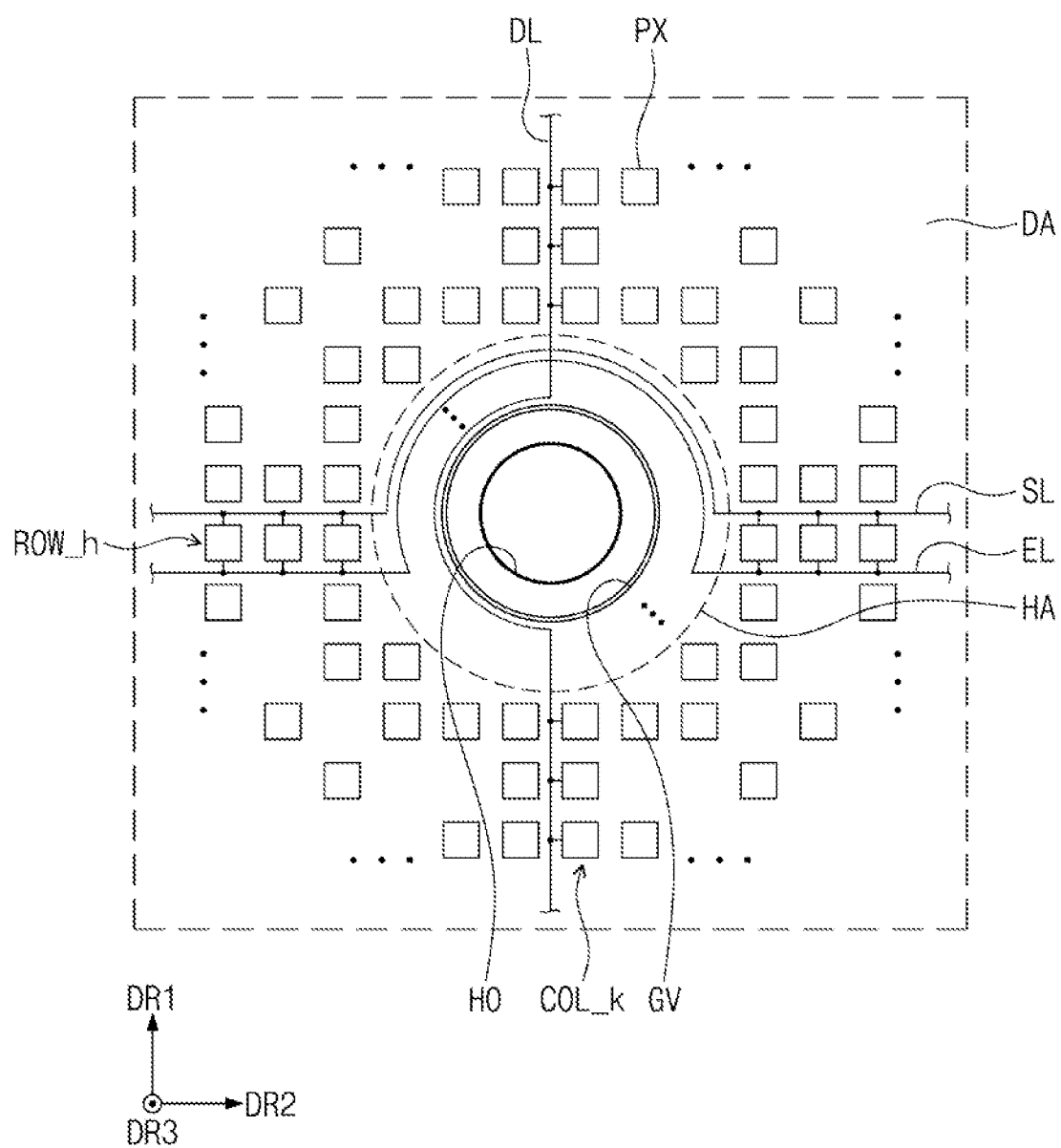
FIG. 6 is an enlarged view of the periphery of the hole area illustrated in FIG. 5 according to an exemplary embodiment of the present inventive concept.

FIG. 6 is an enlarged view of the periphery of the hole area illustrated in FIG. 5.

Referring to FIG. 6, a groove GV may be defined between a boundary of the hole area HA and the hole HO. The groove GV may be disposed along a boundary of the hole HO to surround the hole HO. The groove GV may be provided in plurality. A cross-sectional structure of the groove GV will be described in detail in FIG. 12 below illustrating a cross section of the periphery of the hole HO.

The groove GV may have a circular ring shape. However, this is exemplarily illustrated, and the groove GV may be formed as a closed line of a polygonal or elliptical shape. Further, the groove GV may be formed in a shape including a plurality of patterns partially disconnected. In an exemplary embodiment, the groove GV may accommodate deposition patterns ELP therein. The deposition patterns ELP will be described later with reference to FIG. 12.

The pixels PX may be arranged to surround the hole area HA. Pixels PX of the pixels PX around the hole area HA may be connected to a scan line SL, a data line DL, and an emission line EL extending via the hole area HA. A row to be described below may correspond to the second direction DR2, and a column to be described below may correspond to the first direction DR1.

Pixels PX of an h-th row ROW_h disposed with the hole area HA therebetween may be connected to a scan line SL extending in the second direction DR2 and extending along the boundary of the hole area HA in the hole area HA. The pixels PX of the h-th row ROW_h may be connected to an emission line EL extending in the second direction DR2 and extending along the boundary of the hole area HA in the hole area HA. Here, h is a natural number.

Pixels PX of a k-th column COL_k disposed with the hole area HA therebetween may be connected to a data line DL extending in the first direction DR1 and extending along the boundary of the hole area HA in the hole area HA. Here, k is a natural number.

Figure 7:
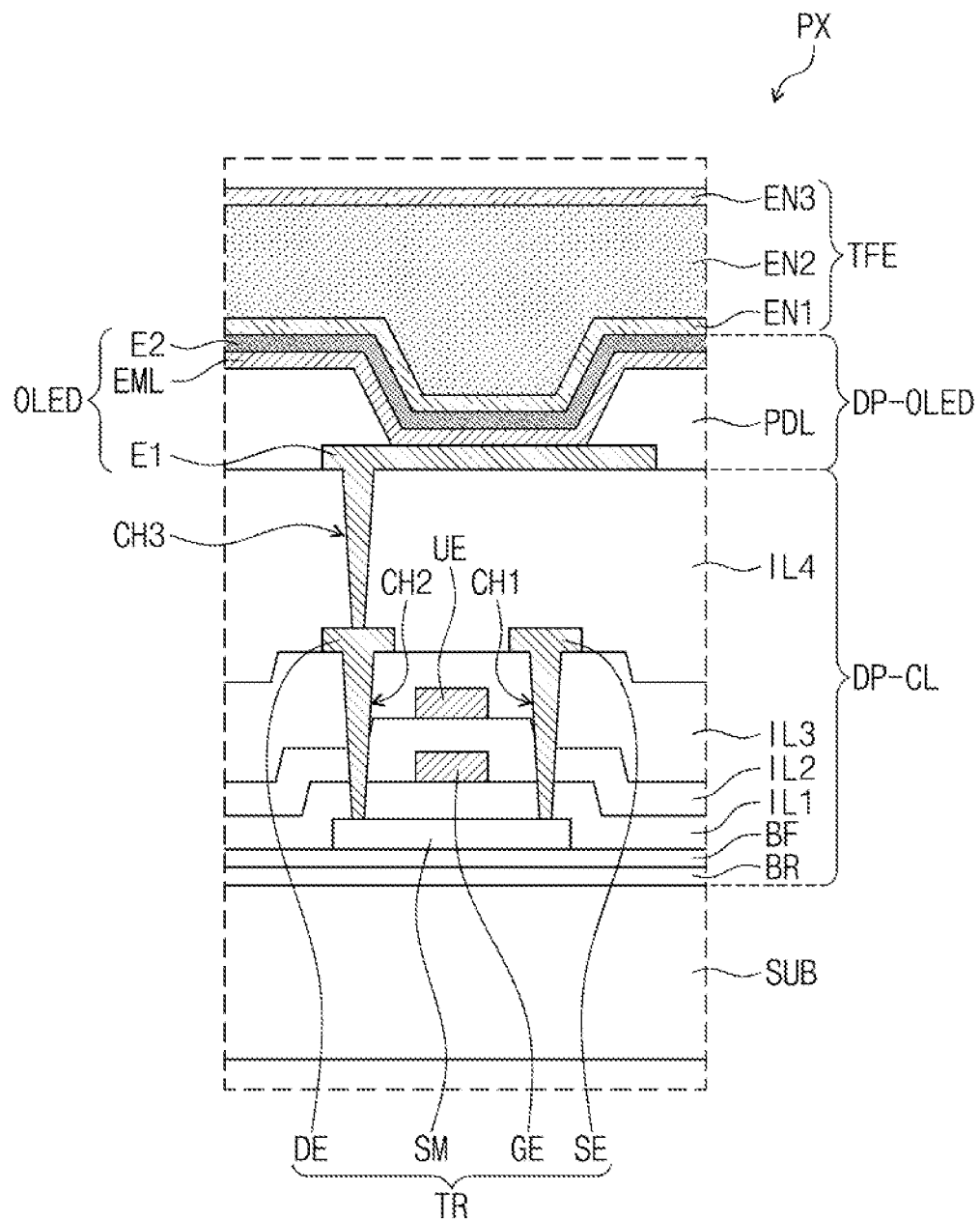
FIG. 7 exemplarily illustrates a cross-sectional configuration of any one of the pixels illustrated in FIG. 5 according to an exemplary embodiment of the present inventive concept.

FIG. 7 exemplarily illustrates a cross-sectional configuration of any one of the pixels illustrated in FIG. 5.

Referring to FIG. 7, each of the pixels PX may be disposed on the substrate SUB and may include a light emitting element OLED and a transistor TR connected to the light emitting element OLED. The light emitting element OLED may include a first electrode E1, a second electrode E2, and a light emitting layer EML. The first electrode E1 may be an anode, and the second electrode E2 may be a cathode. The light emitting element OLED may be defined as an organic light emitting element.

A barrier layer BR may be disposed on the substrate SUB, and a buffer layer BF may be disposed on the barrier layer BR. The barrier layer BR and the buffer layer BF may block oxygen or moisture introduced through the substrate SUB from permeating the pixel PX. In addition, the barrier layer BR and the buffer layer BF may reduce the surface energy of the substrate SUB so that the pixel PX is stably formed on the substrate SUB.

Although the barrier layer BR and the buffer layer BF are exemplarily disposed on the substrate SUB, an embodiment of the inventive concept is not limited thereto. For example, at least one of the barrier layer BR and the buffer layer BF may be omitted. Alternatively, additional layers may be further laminated on the substrate SUB in addition to the barrier layer BR and the buffer layer BF.

A semiconductor layer SM of the transistor TR may be disposed on the buffer layer BF. The semiconductor layer SM may be formed of an inorganic semiconductor material such as amorphous silicon and polysilicon, or an organic semiconductor. In addition, the semiconductor layer SM may include an oxide semiconductor. Although not illustrated in FIG. 7, a source region, a drain region, and a channel region between the source region and the drain region may be included in the semiconductor layer SM.

A first insulating layer IL1 may be disposed on the buffer layer BF to cover the semiconductor layer SM. A gate electrode GE of the transistor TR overlapping the semiconductor layer SM may be disposed on the first insulating layer IL1. The gate electrode GE may be disposed to overlap the channel region of the semiconductor layer SM. A second insulating layer IL2 may be disposed on the first insulating layer IL1 to cover the gate electrode GE.

An upper electrode UE may be disposed on the second insulating layer IL2. When viewed in a plane, the upper electrode UE may overlap the gate electrode GE. The pixel PX may include a capacitor, and the upper electrode UE may function as one electrode of the capacitor by receiving an electrical signal different from that of the gate electrode GE. However, this is exemplarily described, and the upper electrode UE may be omitted in an embodiment of the inventive concept. A third insulating layer IL3 may be disposed on the second insulating layer IL2 to cover the upper electrode UE.

A source electrode SE and a drain electrode DE of the transistor TR may be disposed to be spaced apart from each other on the third insulating layer IL3. The source electrode SE may be connected to the source region of the semiconductor layer SM through a first contact hole CH1 defined in the first, second, and third insulating layers IL1, IL2, and IL3. In an exemplary embodiment, the first contact hole CH1 may penetrate the first, second, and third insulating layers IL1, IL2, and IL3 to expose a portion of the source region of the semiconductor layer SM. The drain electrode DE may be connected to the drain region of the semiconductor layer SM through a second contact hole CH2 defined in the first, second, and third insulating layers IL1, IL2, and IL3. In an exemplary embodiment, the second contact hole CH2 may penetrate the first, second, and third insulating layers IL1, IL2, and IL3 to expose a portion of the drain region of the semiconductor layer SM.

A fourth insulating layer IL4 may be disposed on the third insulating layer IL3 to cover the source electrode SE and the drain electrode DE of the transistor TR.

The first electrode E1 may be disposed on the fourth insulating layer IL4. The first electrode E1 may be connected to the drain electrode DE through a third contact hole CH3 defined in the fourth insulating layer IL4. In an exemplary embodiment, the third contact hole CH3 may penetrate the fourth insulating layer IL4 to expose a portion of the drain electrode DE.

A pixel defining film PDL exposing a predetermined portion of the first electrode E1 may be disposed on the first electrode E1 and the fourth insulating layer IL4. An opening PX_OP for exposing the predetermined portion of the first electrode E1 may be defined in the pixel defining film PDL. In an exemplary embodiment, the opening PX_OP may penetrate the pixel defining film PDL to expose the predetermined portion of the first electrode E1.

The light emitting layer EML may be disposed on the first electrode E1 and the pixel defining film PDL. The second electrode E2 may be disposed on the light emitting layer EML. The light emitting layer EML and the second electrode E2 may be disposed in common on the first electrode E1 and the pixel defining film PDL. The light emitting layer EML may include at least one of materials emitting red light, green light, and blue light and may include a fluorescent material or a phosphorescent material. The light emitting layer EML may include an organic light emitting material or an inorganic light emitting material.

In an embodiment of the inventive concept, the light emitting layer EML is illustrated as a layer having an integral shape on the first electrode E1 and the pixel defining film PDL. However, this is exemplarily illustrated, and the light emitting layer EML may be disposed only in an area corresponding to the opening PX_OP. The light emitting layer EML may further include a charge control layer. The charge control layer may control the movement of charges to increase the luminous efficiency and lifetime of the light emitting element OLED. The charge control layer may include at least one of a hole transport material, a hole injection material, an electron transport material, and an electron injection material.

The thin film encapsulation layer TFE may be disposed on the second electrode E2. The thin film encapsulation layer TFE may include a first encapsulation layer EN1 disposed on the second electrode E2, a second encapsulation layer EN2 disposed on the first encapsulation layer EN1, and a third encapsulation layer EN3 disposed on the second encapsulation layer EN2. The first and third encapsulation layers EN1 and EN3 may be inorganic insulating layers, and the second encapsulation layer EN2 may be an organic insulating layer.

The first and third encapsulation layers EN1 and EN3 may protect the pixels PX from moisture/oxygen. The second encapsulation layer EN2 may protect the pixels PX from foreign matter such as dust particles. The above-described input sensing part ISP may be disposed on the thin film encapsulation layer TFE.

The layers from the barrier layer BR to the fourth insulating layer IL4 may be defined as the circuit element layer DP-CL. The layers from the first electrode E1 to the second electrode E2 may be defined as the display element layer DP-OLED.

A first voltage may be applied to the first electrode E1, and a second voltage lower than the first voltage may be applied to the second electrode E2. Holes and electrons injected into the light emitting layer EML may be combined to each other to generate excitons, and the light emitting element OLED may emit light as the excitons transition to a ground state. The light emitting element OLED may emit light and thus an image may be displayed.

Figure 8:
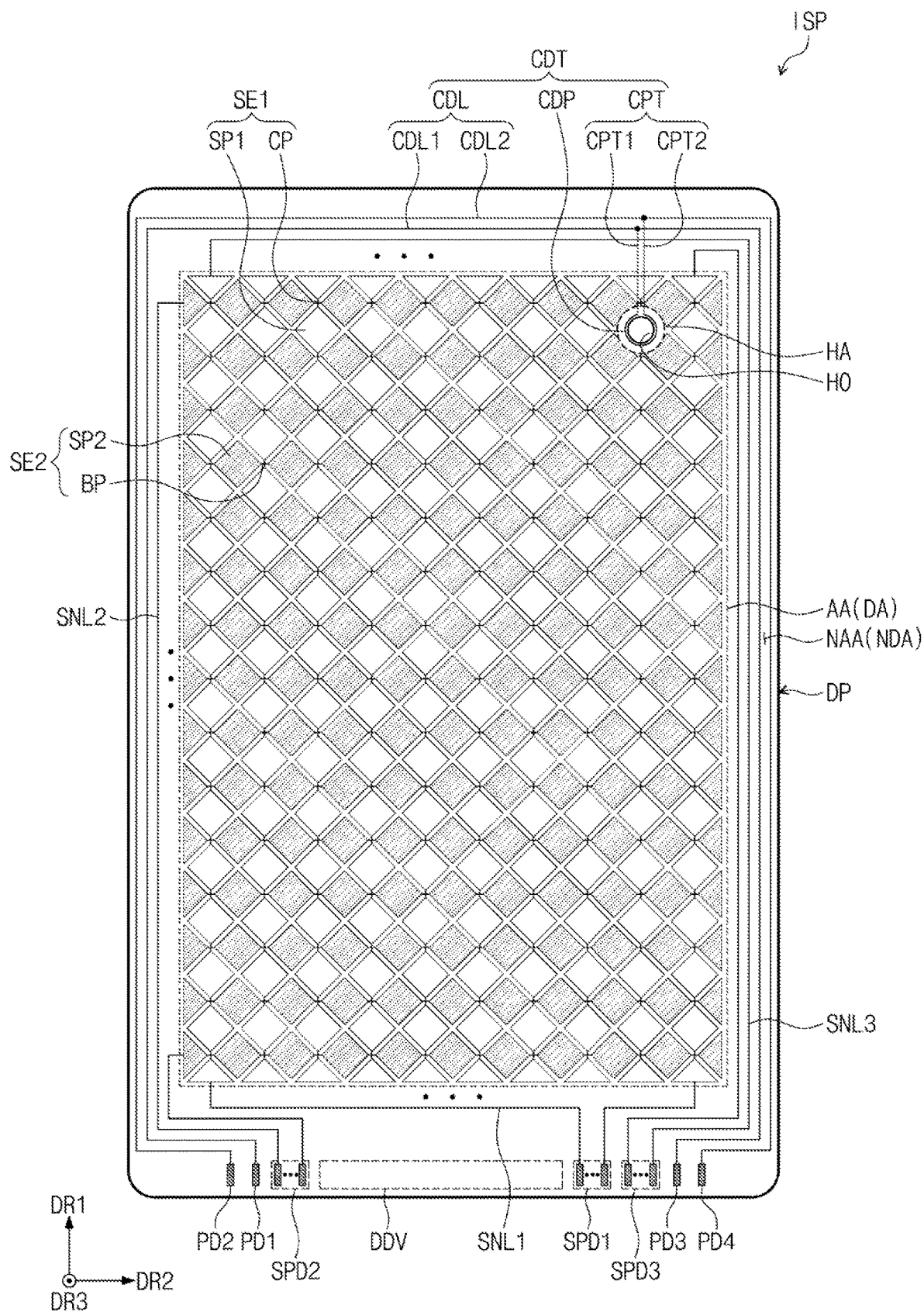
FIG. 8 is a plan view of the input sensing part illustrated in FIG. 3 according to an exemplary embodiment of the present inventive concept.

FIG. 8 is a plan view of the input sensing part illustrated in FIG. 3.

Referring to FIG. 8, the input sensing part ISP may be disposed on the display panel DP. The input sensing part ISP may include a plurality of sensing electrodes SE1 and SE2, a plurality of sensing lines SNL1, SNL2, and SNL3, a plurality of sensing pads SPD1, SPD2, and SPD3, a plurality of first to fourth pads PD1 to PD4, and a crack detection part CDT.

The input sensing part ISP may include a hole area HA in which the hole HO is defined, an active area AA around the hole area HA, and a non-active area NAA around the active area AA. The active area AA may overlap the display area DA, and the non-active area NAA may overlap the non-display area NDA. The active area AA may be defined as a second area, and the non-active area NAA may be defined as a third area.

The sensing electrodes SE1 and SE2 may be disposed in the active area AA. The sensing electrodes SE1 and SE2 may not be disposed in the hole area HA. The sensing lines SNL1, SNL2, and SNL3 may be respectively connected to one ends of the sensing electrodes SE1 and SE2 and the other ends of the sensing electrodes SE1, and may extend to the non-active area NAA to be respectively connected to the sensing pads SPD1, SPD2, and SPD3.

The crack detection part CDT may be disposed in the hole area HA and may extend to the active area AA and be insulated from the sensing electrodes SE1 and SE2. The crack detection part CDT may extend to the non-active area NAA to be connected to the first to fourth pads PD1 to PD4.

The sensing pads SPD1, SPD2, and SPD3 and the first to fourth pads PD1 to PD4 may be connected to an input sensing control unit (not illustrated) for controlling the input sensing part ISP through a flexible printed circuit board (not illustrated).

The sensing electrodes SE1 and SE2 may include a plurality of first sensing electrodes SE1 which extend in the first direction DR1 and are arranged in the second direction DR2 and a plurality of second sensing electrodes SE2 which extend in the second direction DR2 and are arranged in the first direction DR1. The second sensing electrodes SE2 may extend to intersect the first sensing electrodes SE1 in an insulated manner. The first sensing electrodes SE1 may be defined as output sensing electrodes, and the second sensing electrodes SE2 may be defined as input sensing electrodes.

The sensing lines SNL1, SNL2, and SNL3 may include a plurality of first sensing lines SNL1, a plurality of second sensing lines SNL2, and a plurality of third sensing lines SNL3. The first sensing lines SNL1 may be connected to lower ends of the first sensing electrodes SE1 to extend to the non-active area NAA. The second sensing lines SNL2 may be connected to one ends of the second sensing electrodes SE2 to extend to the non-active area NAA. The third sensing lines SNL3 may be connected to upper ends of the first sensing electrodes SE1 to extend to the non-active area NAA.

The sensing pads SPD1, SPD2, and SPD3 may include a plurality of first sensing pads SPD1, a plurality of second sensing pads SPD2, and a plurality of third sensing pads SPD3. When viewed in a plane, the first, second, and third sensing pads SPD1, SPD2, and SPD3 may be disposed adjacent to a lower end of the input sensing part ISP. When viewed in a plane, the first, second, and third sensing pads SPD1, SPD2, and SPD3 may be disposed with an area, in which the data driver DDV is disposed, interposed therebetween.

The data driver DDV may be disposed between the second sensing pads SPD2 and the first and third sensing pads SPD1 and SPD3. For example, the first and third sensing pads SPD1 and SPD3 may be disposed on the right side of the data driver DDV, and the second sensing pads SPD2 may be disposed on the left side of the data driver DDV. The first sensing pads SPD1 may be disposed between the third sensing pads SPD3 and the data driver DDV.

The first sensing lines SNL1 may extend to the non-active area NAA to be connected to the first sensing pads SPD1. The second sensing lines SNL2 may extend to the non-active area NAA to be connected to the second sensing pads SPD2. The third sensing lines SNL3 may extend to the non-active area NAA to be connected to the third sensing pads SPD3.

The input sensing part ISP may be driven in a mutual sensing mode. For example, driving signals may be applied to the second sensing electrodes SE2 through the second sensing lines SNL2, and sensing signals may be output from the first sensing electrodes SE1 through the first and third sensing lines SNL1 and SNL3.

Each of the first sensing electrodes SE1 may include a plurality of first sensors SP1 (i.e., first sensing electrode patterns) arranged in the first direction DR1 and a plurality of connection parts CP connecting the first sensors SP1. In an exemplary embodiment, the first sensors SP1 may be spaced apart from each other in the first direction DR1. Each of the connection parts CP may be disposed between two first sensors SP1 adjacent to each other in the first direction DR1 to electrically connect the two first sensors SP1.

Each of the second sensing electrodes SE2 may include a plurality of second sensors SP2 (i.e., second sensing electrode patterns) arranged in the second direction DR2 and branch parts BP disposed between the second sensors SP2. The second sensors SP2 may be spaced apart from each other in the second direction DR2. Each of the branch parts BP may be disposed between two second sensors SP2 adjacent to each other in the second direction DR2 to extend from the two second sensors SP2. The branch parts BP may be integrally formed with the second sensors SP2.

The first sensors SP1 and the second sensors SP2 may be spaced apart from each other without overlapping and may be alternately arranged. Capacitance may be formed by the first sensors SP1 and the second sensors SP2. The connection parts CP may extend to intersect the branch parts BP in an insulated manner.

The first and second sensors SP1 and SP2 and the branch parts BP may be disposed in the same layer. The connection parts CP may be disposed in a layer different from the layer of the first and second sensors SP1 and SP2 and the branch parts BP. The connection parts CP may be disposed below the first and second sensors SP1 and SP2 and the branch parts BP. The description of "A and B may be disposed in the same layer" or "A may be disposed in the same layer as B" may refer to elements A and B being formed or patterned from the same layer, which may be disposed on an insulating layer, using a photolithography process. The description of "A may be disposed in a layer different from B" may refer to two elements being formed from different layers which are insulated from each other using at least one insulating layer. For example, the element A may be formed from a first layer on an upper surface of the insulating layer, and the element B may be formed from a second layer on a bottom surface of the insulating layer.

First and second sensors SP1 and SP2 adjacent to the hole area HA among the first and second sensors SP1 and SP2 may have a shape different from the shapes of other first and second sensors SP1 and SP2. For example, four second sensors SP2 may surround the hole area HA. A portion of each of the four second sensors SP2 adjacent to the hole area HA may be modified to have a shape corresponding to the boundary of the hole area HA. However, an embodiment of the inventive concept is not limited thereto, and a portion of each of four first sensors SP1 adjacent to the hole area HA may be modified according to the position of the hole area HA.

The crack detection part CDT may include a crack detection pattern CDP, a crack detection line CDL, and a connection portion CPT. The crack detection pattern CDP, the crack detection line CDL, and the connection portion CPT may include a conductive material.

The crack detection pattern CDP may be disposed in the hole area HA. The crack detection pattern CDP may be formed as an open curve (e.g., an open circle) including one end and the other end. The crack detection pattern CDP may be disposed to surround the hole HO in the hole area HA.

The crack detection line CDL may be disposed in the non-active area NAA and extend along the edge of the input sensing part ISP. The crack detection line CDL may be connected to the first to fourth pads PD1 to PD4. The crack detection line CDL may be disposed more outward than the first, second, and third sensing lines SNL1, SNL2, and SNL3.

The crack detection line CDL may include a first crack detection line CDL1 and a second crack detection line CDL2 that is disposed more outward than the first crack detection line CDL1 and is adjacent to the edge of the input sensing part ISP. The first crack detection line CDL1 and the second crack detection line CDL2 may be disposed in the non-active area NAA to extend along an upper end and left and right sides of the input sensing part ISP. The first crack detection line CDL1 and the second crack detection line CDL2 may extend toward a lower end of the input sensing part ISP.

The first pad PD1 and the second pad PD2 may be disposed on a left side of the second sensing pads SPD2. The first pad PD1 may be disposed between the second pad PD2 and the second sensing pads SPD2. The third pad PD3 and the fourth pad PD4 may be disposed on a right side of the third sensing pads SPD3. The third pad PD3 may be disposed between the fourth pad PD4 and the third sensing pads SPD3.

The first crack detection line CDL1 may be connected to the first pad PD1 and the third pad PD3. One end of the first crack detection line CDL1 may be connected to the first pad PD1, and the other end of the first crack detection line CDL1 may be connected to the third pad PD3.

The second crack detection line CDL2 may be connected to the second pad PD2 and the fourth pad PD4. One end of the second crack detection line CDL2 may be connected to the second pad PD2, and the other end of the second crack detection line CDL2 may be connected to the fourth pad PD4.

The connection portion CPT may be connected to the crack detection pattern CDP and extend in the first direction DR1. The connection portion CPT may extend to the non-active area NAA via first and second sensing electrodes SE1 and SE2 between the hole area HA and the non-active area NAA. The connection portion CPT may be insulated from the first and second sensing electrodes SE1 and SE2. The connection portion CPT may be connected to the crack detection line CDL in the non-active area NAA.

The connection portion CPT may include a first connection portion CPT1 and a second connection portion CPT2 which extend in the first direction DR1 and are spaced apart from each other in the second direction DR2. The first connection portion CPT1 may be connected to one end of the crack detection pattern CDP and the first crack detection line CDL1. In an exemplary embodiment, the one end of the crack detection pattern CDP and the first crack detection line CDL1 may be connected to each other via the first connection portion CPT1. The second connection portion CPT2 may be connected to the other end of the crack detection pattern CDP and the second crack detection line CDL2. In an exemplary embodiment, the other end of the crack detection pattern CDP and the second crack detection line CDL2 may be connected to each other via the second connection portion CPT2.

Damage to the display device DD, such as a crack in the hole area HA or the non-active area NAA, may be detected by the crack detection part CDT. The first pad PD1 and the third pad PD3 may be input terminals, and the second pad PD2 and the fourth pad PD4 may be output terminals.

An electrical signal received through the first pad PD1 may be output to the second pad PD2 after passing through the first crack detection line CDL1, the crack detection pattern CDP, and the second crack detection line CDL2. In addition, an electrical signal received through the third pad PD3 may be output to the fourth pad PD4 after passing through the first crack detection line CDL1, the crack detection pattern CDP, and the second crack detection line CDL2.

When the level of a signal detected at each of the second pad PD2 and the fourth pad PD4 is lower than the level of a reference signal or is at a zero level, both of the first and second crack detection lines CDL1 and CDL2 may be damaged, or the crack detection pattern CDP may be damaged. Accordingly, whether a crack has occurred in the hole area HA may be detected.

In addition, when only a signal detected at any one of the second pad PD2 and the fourth pad PD4 is determined as defective, the crack detection line CDL may be damaged. Accordingly, whether a crack has occurred in the non-active area NAA may be detected.

In an embodiment of the inventive concept, whether the display device DD has cracked may be easily detected by the crack detection part CDT. Accordingly, it is possible to detect whether the display device DD is defective without a separate inspection circuit or inspection apparatus. A more detailed configuration of the crack detection part CDT will be described in detail below.

Figure 9:
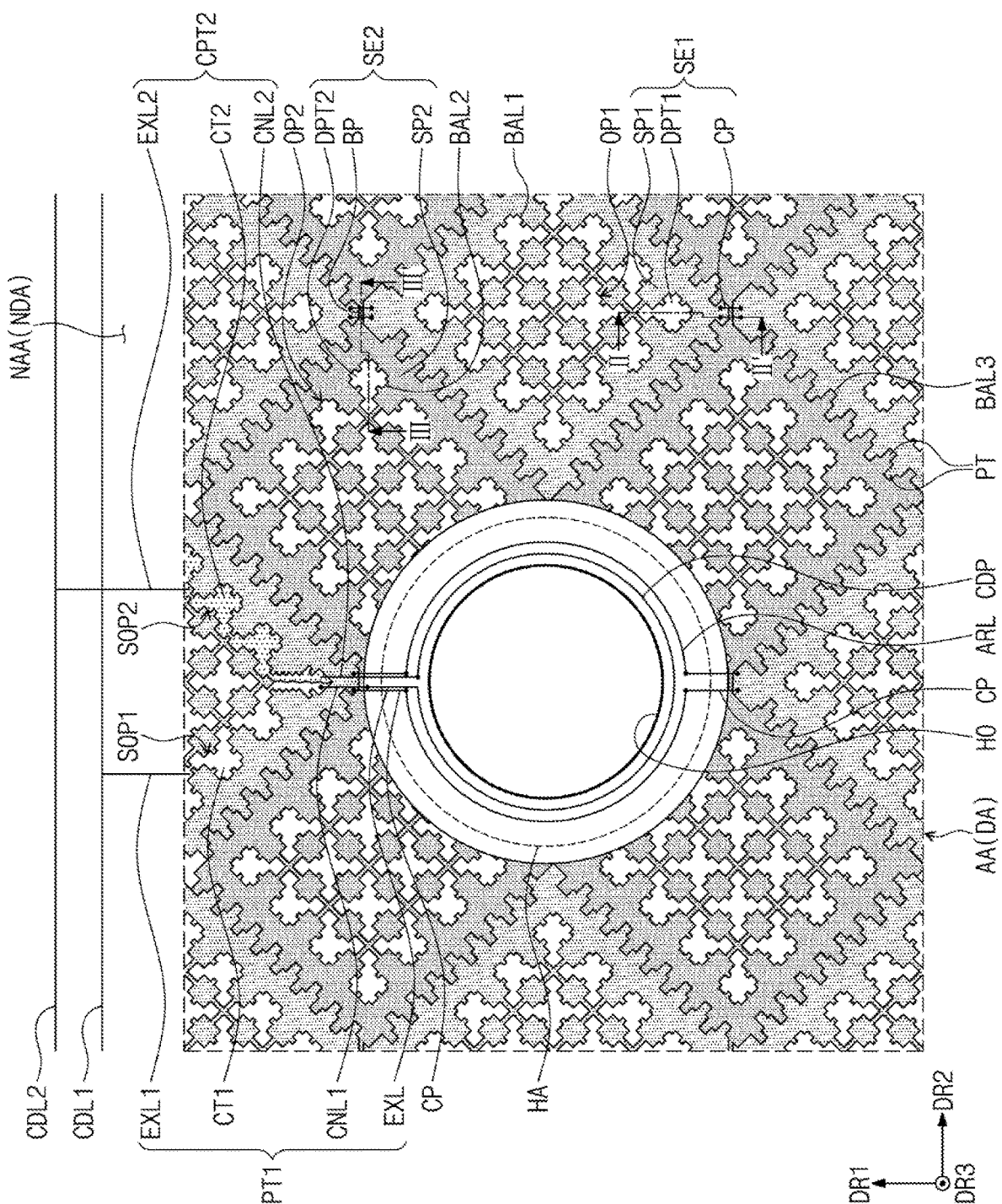
FIG. 9 is an enlarged view of first and second sensors disposed around a hole area according to an exemplary embodiment of the present inventive concept.
Figure 10:
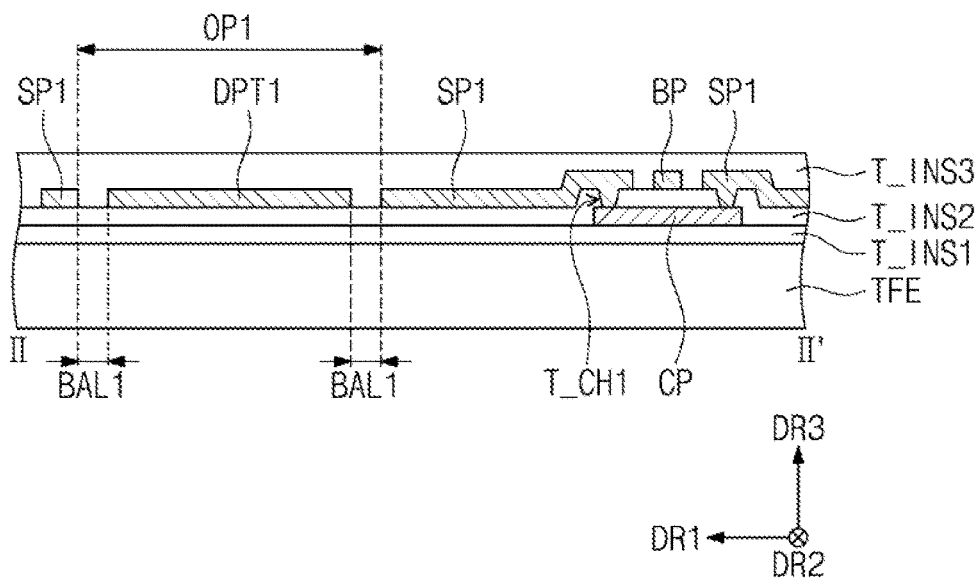
FIG. 10 is a cross-sectional view taken along line II-II' illustrated in FIG. 9 according to an exemplary embodiment of the present inventive concept.
Figure 11:
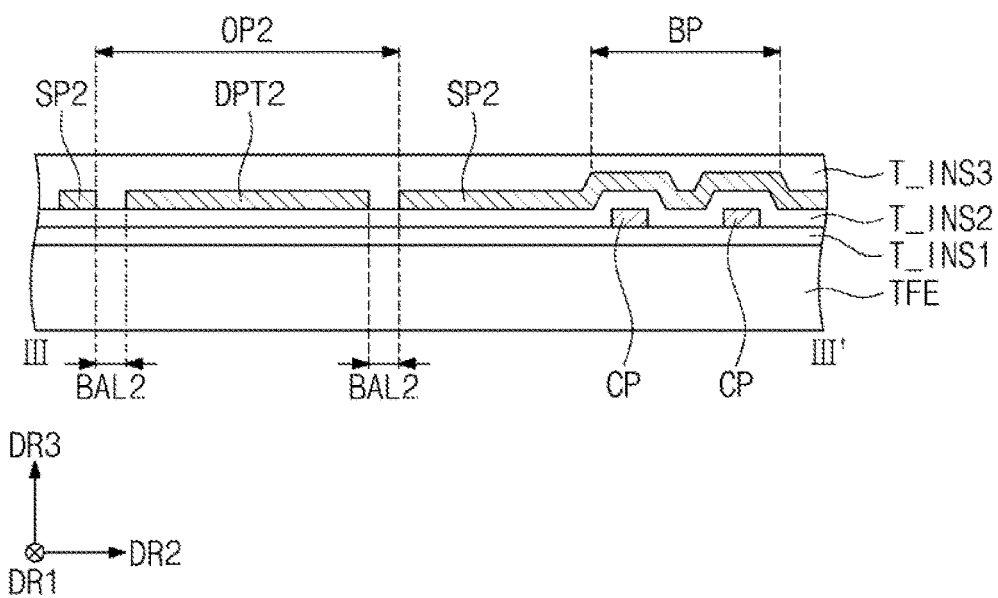
FIG. 11 is a cross-sectional view taken along line III-III' illustrated in FIG. 9 according to an exemplary embodiment of the present inventive concept.

FIG. 9 is an enlarged view of first and second sensors disposed around the hole area. FIG. 10 is a cross-sectional view taken along line II-II' illustrated in FIG. 9. FIG. 11 is a cross-sectional view taken along line III-III' illustrated in FIG. 9.

By way of example, first and second sensors SP1 and SP2 disposed on the thin film encapsulation layer TFE are illustrated in FIGS. 10 and 11, and the elements below the thin film encapsulation layer TFE are omitted.

Referring to FIGS. 9 and 10, each of the first sensing electrodes SE1 may include the plurality of first sensors SP1, a plurality of first dummy patterns DPT1, and the plurality of connection parts CP. The first dummy patterns DPT1 may be disposed in a plurality of first openings OP1 defined in each of the first sensors SP1. In an exemplary embodiment, the plurality of first openings OP may penetrate each of the first sensors SP1 to provide spaces to accommodate the first dummy patterns DPT1 therein. The connection parts CP may connect the first sensors SP1.

In FIG. 9, for the simplicity of drawings, a boundary BAL1 between the first dummy patterns DPT1 and the first sensors SP1 in which the first openings OP1 are defined is exemplarily illustrated as a line. As illustrated in FIG. 10, however, the first sensors SP1 and the first dummy patterns DPT1 may be spaced apart and insulated from each other at the boundary BAL1 between the first sensors SP1 and the first dummy patterns DPT1.

A first insulating layer T_INS1 may be disposed on the thin film encapsulation layer TFE. The connection parts CP may be disposed on the first insulating layer T_INS1. A second insulating layer T_INS2 may be disposed on the first insulating layer T_INS1 to cover the connection parts CP. The first sensors SP1, the branch parts BP, and the first dummy patterns DPT1 may be disposed on the second insulating layer T_INS2. The first sensors SP1 may be connected to the connection parts CP through a plurality of first contact holes T_CH1 defined in the second insulating layer T_INS2. In an exemplary embodiment, the first contact holes T_CH1 may penetrate the second insulating layer T_INS2 to expose portions of the connection parts CP.

A third insulating layer T_INS3 may be disposed on the second insulating layer T_INS2 to cover the first sensors SP1, the branch parts BP, and the first dummy patterns DPT1. Each of the first, second, and third insulating layers T_INS1, T_INS2, and T_INS3 may include an inorganic film and/or an organic film.

Referring to FIGS. 9 and 11, each of the second sensing electrodes SE2 may include the plurality of second sensors SP2, a plurality of second dummy patterns DPT2, and the plurality of branch parts BP. The second dummy patterns DPT2 may be disposed in a plurality of second openings OP2 defined in each of the second sensors SP2. In an exemplary embodiment, the second openings OP2 may penetrate each of the second sensors SP2 to provide spaces to accommodate the second dummy patterns DPT2 therein.

In FIG. 9, for the simplicity of drawings, a boundary BAL2 between the second dummy patterns DPT2 and the second sensors SP2 in which the second openings OP2 are defined is exemplarily illustrated as a line. As illustrated in FIG. 11, however, the second sensors SP2 and the second dummy patterns DPT2 may be spaced apart and insulated from each other at the boundary BAL2 between the second sensors SP2 and the second dummy patterns DPT2.

The second sensors SP2, the branch parts BP, and the second dummy patterns DPT2 may be disposed on the second insulating layer T_INS2. Each of the branch parts BP may extend from two second sensors SP2 adjacent to each other. The branch parts BP may be integrally formed with the second sensors SP2. The branch parts BP may extend to intersect the connection parts CP. The branch parts BP may be insulated from the connection parts CP by the second insulating layer T_INS2.

The third insulating layer T_INS3 may be disposed on the second insulating layer T_INS2 to cover the second sensors SP2, the branch parts BP, and the second dummy patterns DPT2.

Referring to FIG. 9, for the simplicity of drawings, a boundary BAL3 between the first sensors SP1 and the second sensors SP2 is illustrated as a line. However, the first sensors SP1 and the second sensors SP2 may be spaced apart from each other and insulated from each other at the boundary BAL3.

Each of the first sensors SP1 and the second sensors SP2 may have an approximate rhombus shape. In addition, a plurality of protruding patterns PT may be defined at the edge of each of the first sensors SP1 and the second sensors SP2. For example, the protruding patterns PT may render each of the first sensors SP1 and each of the second sensors SP2 to have a corrugated edge, and one first sensor SP1 and another second sensor SP2 adjacent thereto may be fitted into each other through their corrugated edges.

The first connection portion CPT1 may include an extension line EXL, a first connection line CNL1, a first connection pattern CT1, and a first extension line EXL1. The second connection portion CPT2 may include a second connection line CNL2, a second connection pattern CT2, and a second extension line EXL2. The first connection pattern CT1 and the second connection pattern CT2 may be defined as a connection pattern.

The first and second connection patterns CT1 and CT2 may be insulated from the sensing electrodes SE1 and SE2. For example, some openings of first openings OP1 disposed between the hole area HA and the non-active area NAA (or the non-display area NDA) may be opened toward the non-active area NAA. Some openings opened toward the non-active area NAA may be defined as a first sub opening SOP1 and a second sub opening SOP2. In an exemplary embodiment, the first and second connection patterns CT1 and CT2 may be formed in one of the first sensors SP1 having the first sub opening SOP1 and the second sub opening SOP2. The first sub opening SOP1 may have a shape of at least two or more openings OP1 connected to one another in the first sensor SP1 where the first dummy patterns DPT1 are formed instead of the first and second connection patterns CT1 and CT2.

The first connection pattern CT1 may be disposed in the first sub opening SOP1. The second connection pattern CT2 may be disposed in the second sub opening SOP2. Because the first and second connection patterns CT1 and CT2 are respectively disposed in the first and second sub openings SOP1 and SOP2, the first and second connection patterns CT1 and CT2 may be spaced apart and insulated from the first sensors SP1.

The crack detection pattern CDP may be disposed in the same layer as the first sensors SP1, the branch parts BP, and the second sensors SP2. The first connection pattern CT1 may be disposed in a layer different from a layer of the second connection pattern CT2. The first connection pattern CT1 may be disposed in the same layer as the crack detection pattern CDP, and the second connection pattern CT2 may be disposed in a layer different from a layer of the crack detection pattern CDP. The second connection pattern CT2 may be disposed in the same layer as the connection parts CP.

The first and second connection patterns CT1 and CT2 may be connected to the crack detection pattern CDP through the first and second connection lines CNL1 and CNL2 and the extension line EXL. The first and second connection patterns CT1 and CT2 may be respectively connected to the first and second crack detection lines CDL1 and CDL2 through the first and second extension lines EXL1 and EXL2.

The first connection pattern CT1 may be connected to the one end of the crack detection pattern CDP through the extension line EXL and the first connection line CNL1. Specifically, the extension line EXL may be disposed in the same layer as the crack detection pattern CDP and may extend from the one end of the crack detection pattern CDP toward the first connection pattern CT1. The first connection line CNL1 may be disposed in the same layer as the second connection pattern CT2 and may connect the first connection pattern CT1 and the extension line EXL.

The first crack detection line CDL1 may be connected to the first connection pattern CT1 using the first extension line EXL1. For example, the first extension line EXL1 may be disposed in the same layer as the first connection pattern CT1 and may extend from the first connection pattern CT1 to the first crack detection line CDL1. The first extension line EXL1 may be disposed in the non-active area NAA (or the non-display area NDA) to extend in the first direction DR1. The first crack detection line CDL1 may be disposed in the same layer as the first extension line EXL1 and may extend from the first extension line EXL1. In an example embodiment, the first crack detection line CDL1 may be connected to the first extension line EXL1 and extend along a boundary between the display area DA and the non-display area NDA.

The second connection pattern CT2 may be connected to the other end of the crack detection pattern CDP through the second connection line CNL2. Specifically, the second connection line CNL2 may be disposed in the same layer as the second connection pattern CT2 and may extend from the second connection pattern CT2 to the hole area HA. The second connection line CNL2 may be connected to the other end of the crack detection pattern CDP.

The second crack detection line CDL2 may be connected to the second connection pattern CT2 using the second extension line EXL2. For example, the second extension line EXL2 may be disposed in the same layer as the second connection pattern CT2 and may extend from the second connection pattern CT2 to the second crack detection line CDL2. The second extension line EXL2 may be disposed in the non-active area NAA (or the non-display area NDA) to extend in the first direction DR1. The second crack detection line CDL2 may be disposed in the same layer as the second extension line EXL2 and may extend from the second extension line EXL2. In an example embodiment, the second crack detection line CDL2 may be connected to the second extension line EXL2 and extend along a boundary between the display area DA and the non-display area NDA.

The first connection line CNL1 and the second connection line CNL2 may extend to intersect a branch part BP disposed between the hole area HA and the non-active area NAA among the branch parts BP. Because the first connection line CNL1 and the second connection line CNL2 are disposed in the same layer as the connection parts CP, the first connection line CNL1 and the second connection line CNL2 may be insulated from the branch part BP.

A first sensor SP1 disposed on an upper side of the hole area HA and a first sensor SP1 disposed on a lower side of the hole area HA may be connected through bypass lines ARL. The bypass lines ARL may extend along the periphery of the hole HO and may be disposed in the same layer as the first sensors SP1. The bypass lines ARL may be disposed more outward than the crack detection pattern CDP.

The first sensor SP1 disposed on the upper side of the hole area HA and the first sensor SP1 disposed on the lower side of the hole area HA may be connected to the bypass lines ARL through connection parts CP disposed with the extension line EXL and the second connection line CNL2 interposed therebetween. For example, the bypass lines ARL may be connected to the connection parts CP through contact holes (not illustrated) defined in the second insulating layer T_INS2. In an exemplary embodiment, the contact holes may penetrate the second insulating layer T_INS2 to expose portions of the connection parts CP. However, this is exemplarily described, and the bypass lines ARL may be disposed in the same layer as the connection parts CP and may extend from the connection parts CP.

Figure 12:
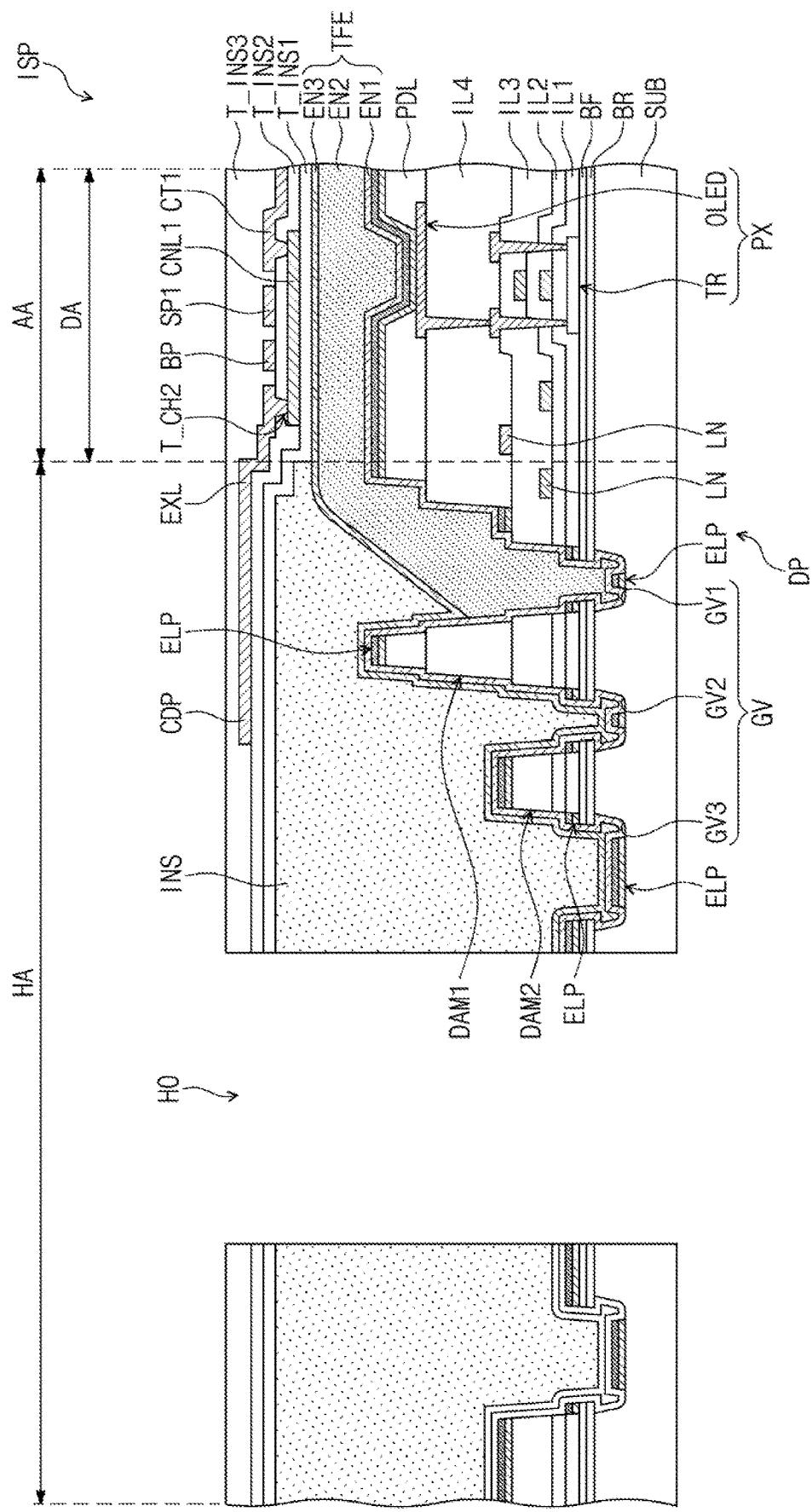
FIG. 12 exemplarily illustrates a cross-sectional configuration from the hole area and the crack detection pattern illustrated in FIG. 9 to the first connection pattern illustrated in FIG. 9 according to an exemplary embodiment of the present inventive concept.

FIG. 12 exemplarily illustrates a cross-sectional configuration from the hole area and the crack detection pattern illustrated in FIG. 9 to the first connection pattern illustrated in FIG. 9.

Referring to FIG. 12, a groove GV may be defined between the hole HO and the boundary of the hole area HA. The groove GV may be provided in plurality. For example, the groove GV may include a first groove GV1, a second groove GV2, and a third groove GV3. The first groove GV1, the second groove GV2, and the third groove GV3 may have a shape of a closed line surrounding the hole HO. However, an embodiment of the inventive concept is not limited thereto, and the first groove GV1, the second groove GV2, and the third groove GV3 may also have a shape of a dashed line surrounding some portions of the edge of the hole HO.

Each of the first groove GV1, the second groove GV2, and the third groove GV3 may be defined to be recessed down from a top surface of the substrate SUB by a predetermined depth. Each of the first groove GV1, the second groove GV2, and the third groove GV3 may be formed by removing a portion of the substrate SUB. The first groove GV1 may be adjacent to a boundary between the hole area HA and the display area DA. The third groove GV3 may be adjacent to the hole HO. The second groove GV2 may be disposed between the first groove GV1 and the third groove GV3.

Deposition patterns ELP may be disposed in the first groove GV1, the second groove GV2, and the third groove GV3. The deposition patterns ELP may include the same materials as the light emitting layer EML and the second electrode E2, and may be formed together when the light emitting layer EML and the second electrode E2 are formed. In an exemplary embodiment, the deposition patterns ELP may include patterned light emitting layers and patterned second electrodes which are stacked on each other. The deposition patterns ELP may be covered by the first encapsulation layer EN1.

Because the deposition patterns ELP are disposed in the first, second, and third grooves GV1, GV2, and GV3 in an embodiment of the inventive concept, the deposition patterns ELP may not be continuously disposed from the light emitting layer EML. Continuity between the deposition patterns ELP and the light emitting layer EML may be interrupted by the first, second, and third grooves GV1, GV2, and GV3. In an exemplary embodiment, the deposition patterns ELP may not be continuously disposed, but may be disposed to be spaced apart from each other.

In order to form the hole HO, a portion of the display panel DP in the hole area HA may be cut out. In the cutting process, external moisture or oxygen may be introduced into the display panel DP through the cut surface of the hole HO.

A deposition pattern ELP may be formed to extend from the light emitting layer EML, and the deposition pattern ELP may be continuously disposed up to the hole HO. In this case, external moisture or oxygen introduced through the hole HO may permeate the active area AA through the deposition pattern ELP. The elements disposed in the active area AA may be damaged by moisture or oxygen permeating the active area AA.

In an embodiment of the inventive concept, however, the deposition patterns ELP are spaced apart from the light emitting layer EML of the display element layer DP-OLED, and the deposition patterns ELP are disposed to be spaced apart from each other, so that external moisture or oxygen introduced through the hole HO may be blocked. As a result, damage to the elements disposed in the active area AA may be prevented.

Although the three first, second, and third grooves GV1, GV2, and GV3 are illustrated by way of example, an embodiment of the inventive concept is not limited thereto, and a single groove may be provided around the hole HO or the grooves may also be omitted.

A plurality of dams DAM1 and DAM2 may be disposed on the substrate SUB between the first groove GV1, the second groove GV2, and the third groove GV3. The dams DAM1 and DAM2 may include a first dam DAM1 disposed on the substrate SUB between the first groove GV1 and the second groove GV2 and a second dam DAM2 disposed on the substrate SUB between the second groove GV2 and the third groove GV3. Deposition patterns ELP may be further disposed on the first and second dams DAM1 and DAM2.

The first dam DAM1 may be formed from the barrier layer BR, the buffer layer BF, the first to fourth insulating layers IL1 to IL4, and the pixel defining film PDL. The second dam DAM2 may be formed from the barrier layer BR, the buffer layer BF, and the first to third insulating layers IL1 to IL3. However, this is exemplarily illustrated, and the first and second dams DAM1 and DAM2 may also have a single layer structure.

A barrier layer BR may be disposed on the substrate SUB between the hole HO and the third groove GV3. A buffer layer BF may be disposed on the barrier layer BR between the hole HO and the third groove GV3. A deposition pattern ELP may be further disposed on the buffer layer BF between the hole HO and the third groove GV3.

The width of each of the first and second dams DAM1 and DAM2 may be smaller toward an upper portion thereof. In FIG. 12, the width is a value measured with respect to a horizontal direction. The width of the barrier layer BR and the buffer layer BF of the first dam DAM1 and the width of the barrier layer BR and the buffer layer BF of the second dam DAM2 may respectively be greater than the widths of portions of the substrate SUB between the first, second, and third grooves GV1, GV2, and GV3. This is because an etching amount of the substrate SUB and an etching amount of the barrier layer BR and the buffer layer BF are different in an etching process due to the difference between the material of the substrate SUB and the material of the barrier layer BR and the buffer layer BF.

In a cross-sectional structure, the widths of the first, second, and third insulating layers IL1, IL2, and IL3 disposed on each of the first and second dams DAM1 and DAM2 may be smaller than the widths of the barrier layer BR and the buffer layer BF disposed on each of the first and second dams DAM1 and DAM2. In addition, the width of the fourth insulating layer IL4 disposed on each of the first and second dams DAM1 and DAM2 may be smaller than the widths of the first, second, and third insulating layers 1, IL2, and IL3 disposed on each of the first and second dams DAM1 and DAM2. Furthermore, the width of the pixel defining film PDL disposed on each of the first and second dams DAM1 and DAM2 may be smaller than the width of the fourth insulating layer IL4 disposed on each of the first and second dams DAM1 and DAM2. The deposition patterns ELP may be further disposed on portions of the buffer layer BF that does not overlap the first, second, and third insulating layers IL1, IL2, and IL3. In an exemplary embodiment, the deposition patterns ELP may be disposed in the first to third grooves GV1 to GV3, on the first and second dams DAM1 and DAM2, and on the portions of the buffer layer BF which are not overlap the first to third insulating layers IL1, IL2 and IL3.

Wiring patterns LN may be disposed on the second insulating layer IL2 and the third insulating layer IL3. The wiring patterns LN may be a power line for supplying power to the data lines DL illustrated in FIG. 5 or the transistor TR.

The first encapsulation layer EN1 and the third encapsulation layer EN3 may extend to the hole area HA. The first and second dams DAM1 and DAM2 may define an area in which the second encapsulation layer EN2 including an organic material is formed. For example, the second encapsulation layer EN2 may extend to the hole area HA and may be disposed up to the first dam DAM1.

The first encapsulation layer EN1 may be disposed on the substrate SUB and the first and second dams DAM1 and DAM2 in the hole area HA. As described above, the first encapsulation layer EN1 may be disposed on the substrate SUB to cover the deposition patterns ELP in the hole area HA. The third encapsulation layer EN3 may be disposed on the first encapsulation layer EN1 in the hole area HA.

When the display device DD is manufactured, an organic material having fluidity may be cured to form the second encapsulation layer EN2. Even when an organic material having fluidity flows into the hole area HA, the first dam DAM1 may block the organic material. The second dam DAM2 may additionally block the organic material overflowing the first dam DAM1.

The sensing electrodes SE1 and SE2 may be disposed on the display area DA. An insulating layer INS (i.e., a first-first insulating layer) may be disposed in the hole area HA of the display panel DP. The insulating layer INS may be disposed on the third encapsulation layer EN3 in the hole area HA. An edge of the insulating layer INS disposed at a boundary between the display area DA and the hole area HA may have a step structure of at least two steps.

The crack detection pattern CDP may be disposed in the hole area HA. The crack detection pattern CDP may be disposed on the insulating layer INS in the hole area HA. When viewed in a plane, the crack detection pattern CDP having an open curve shape (e.g., an open circle) may overlap the second groove GV2 by way of example, but an embodiment of the inventive concept is not limited thereto. For example, when viewed in a plane, the crack detection pattern CDP may overlap the first groove GV1 or may overlap the third groove GV3. When viewed in a plane, alternatively, the crack detection pattern CDP may be disposed between the first groove GV1 and the second groove GV2 or between the second groove GV2 and the third groove GV3, and thus may not overlap the first, second, and third grooves GV1, GV2, and GV3.

The first insulating layer T_INS1 disposed on the thin film encapsulation layer TFE of the display area DA may extend over the insulating layer INS disposed in the hole area HA. The second insulating layer T_INS2 may extend to the hole area HA to be disposed on the first insulating layer T_INS1 in the hole area HA. The third insulating layer T_INS3 may extend to the hole area HA to be disposed on the second insulating layer T_INS2 in the hole area HA.

The crack detection pattern CDP, the extension line EXL extending from the crack detection pattern CDP, and the first connection pattern CT1 may be disposed on the second insulating layer T_INS1. The first connection line CNL1 may be disposed on the first insulating layer T_INS1. The second insulating layer T_INS2 may be disposed on the first connection line CNL1.

The extension line EXL and the first connection pattern CT1 may be connected to the first connection line CNL1 through a plurality of second contact holes T_CH2 defined in the second insulating layer T_INS2. In an exemplary embodiment, the second contact holes T_CH2 may penetrate the second insulating layer T_INS2 to expose a portion of the first connection line CNL1. The first connection line CNL1 may be insulated from the branch part BP and the first sensor SP1 by the second insulating layer T_INS2.

The third insulating layer T_INS3 may be disposed on the second insulating layer T_INS2 to cover the crack detection pattern CDP, the extension line EXL, and the first connection pattern CT1.

Figure 13:
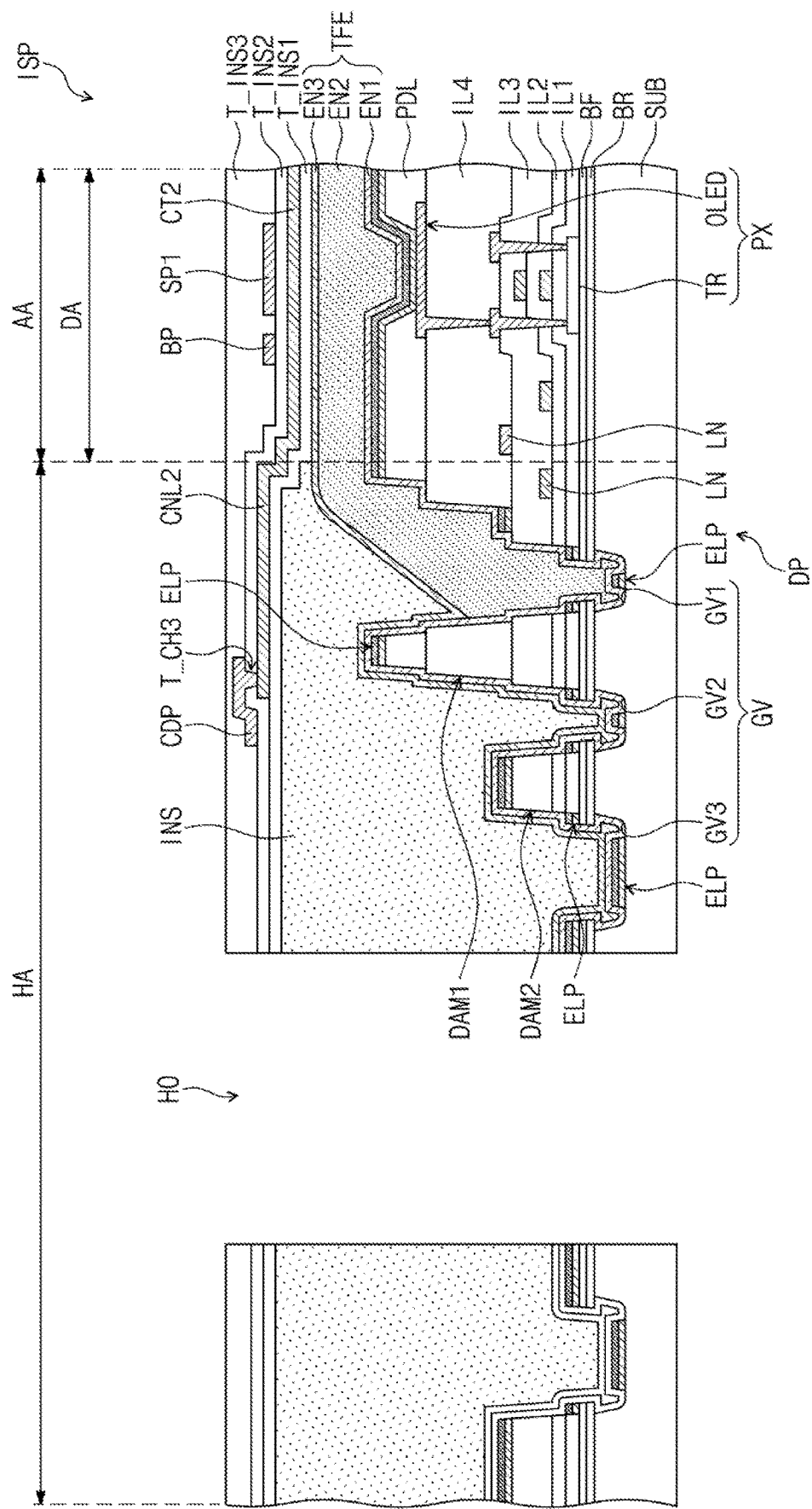
FIG. 13 exemplarily illustrates a cross-sectional configuration from the hole area and the crack detection pattern illustrated in FIG. 9 to the second connection pattern illustrated in FIG. 9 according to an exemplary embodiment of the present inventive concept.
Figure 14:
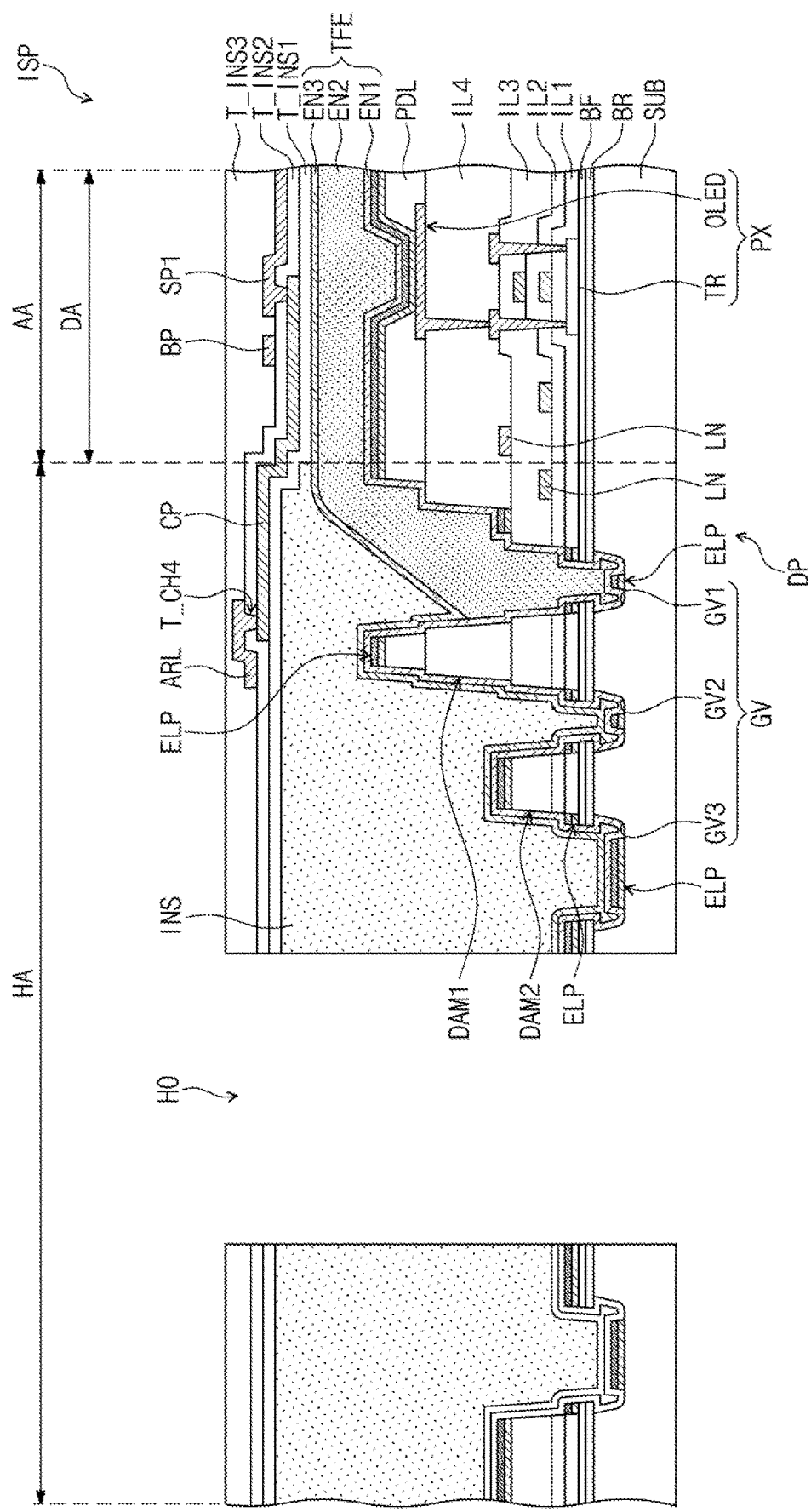
FIG. 14 exemplarily illustrates a cross-sectional configuration from the hole area and one of the bypass lines illustrated in FIG. 9 to the first sensor, adjacent to the hole area, illustrated in FIG. 9 according to an exemplary embodiment of the present inventive concept.

FIG. 13 exemplarily illustrates a cross-sectional configuration from the hole area and the crack detection pattern illustrated in FIG. 9 to the second connection pattern illustrated in FIG. 9. FIG. 14 exemplarily illustrates a cross-sectional configuration from the hole area and one of the bypass lines illustrated in FIG. 9 to the first sensor, adjacent to the hole area, illustrated in FIG. 9.

Hereinafter, a description of an element the same as the element described with reference to FIG. 12 will not be given for FIGS. 13 and 14.

Referring to FIG. 13, the second connection pattern CT2 and the second connection line CNL2 extending from the second connection pattern CT2 may be disposed on the first insulating layer T_INS1. The second insulating layer T_INS2 may be disposed on the second connection pattern CT2 and the second connection line CNL2.

The crack detection pattern CDP may be connected to the second connection line CNL2 through a third contact hole T_CH3 defined in the second insulating layer T_INS2. In an exemplary embodiment, the third contact hole T_CH3 may penetrate the second insulating layer T_INS2 to expose a portion of the second connection line CNL2. The second connection line CNL2 may be insulated from the branch part BP and the first sensor SP1 by the second insulating layer T_INS2.

Referring to FIG. 14, a bypass line ARL may be disposed on the second insulating layer T_INS2. The bypass line ARL and the first sensor SP1 may be connected to a connection part CP, which corresponds to the bypass line ARL, through a plurality of fourth contact holes T_CH4 defined in the second insulating layer T_INS2. In an exemplary embodiment, the fourth contact holes T_CH4 may penetrate the second insulating layer T_INS2 to expose portions of the connection part CP. The third insulating layer T_INS3 may be disposed on the second insulating layer T_INS2 to cover the bypass line ARL.

Figure 15:
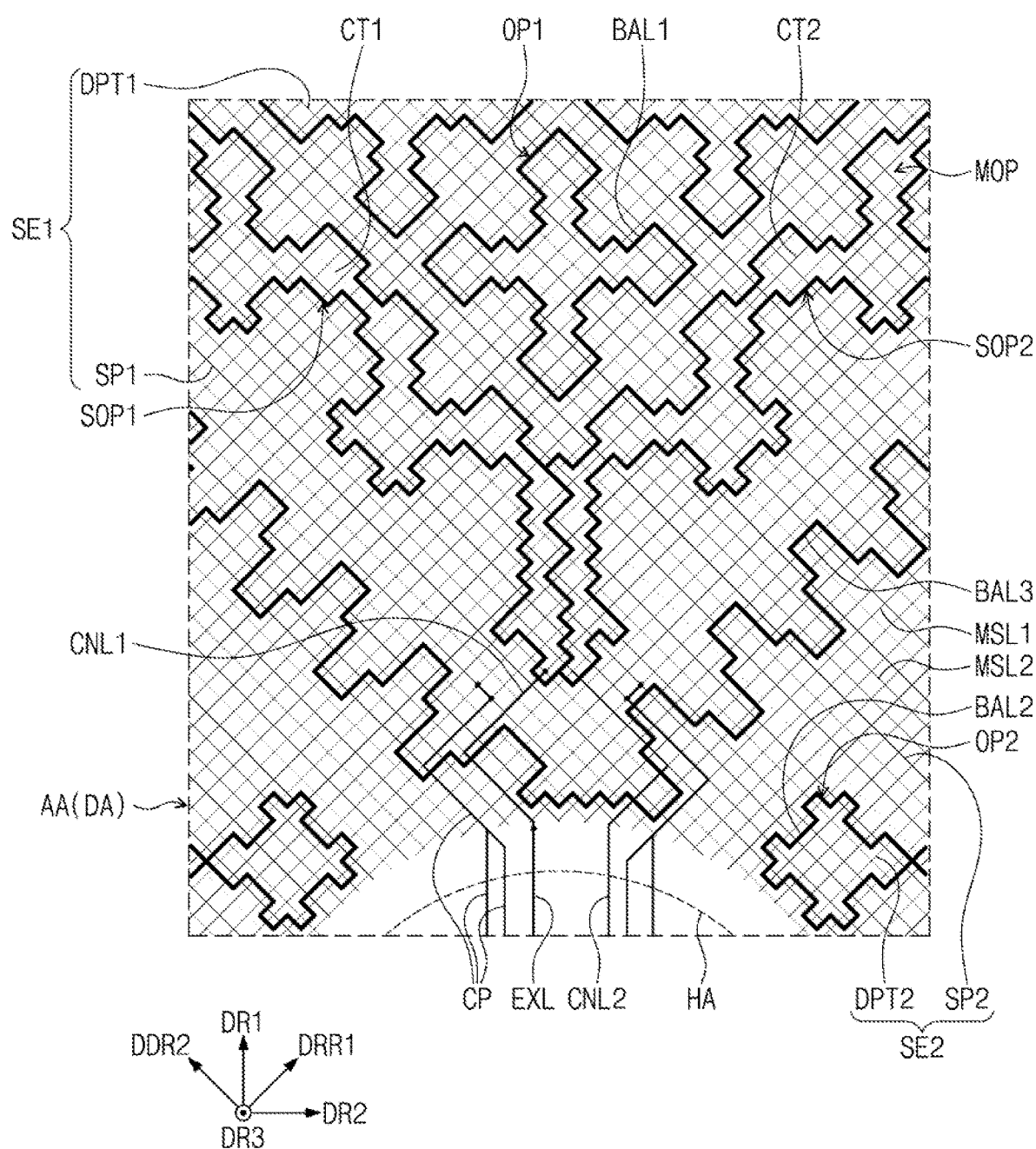
FIG. 15 illustrates a mesh structure of the sensing electrodes and the connection pattern adjacent to an upper end of the hole area illustrated in FIG. 9 according to an exemplary embodiment of the present inventive concept.

FIG. 15 illustrates a mesh structure of the sensing electrodes and the connection pattern adjacent to an upper end of the hole area illustrated in FIG. 9.

Referring to FIG. 15, each of the first and second sensors SP1 and SP2, the first and second dummy patterns DPT1 and DPT2, and the first and second connection patterns CT1 and CT2 may have a mesh shape. For example, each of the first and second sensors SP1 and SP2, the first and second dummy patterns DPT1 and DPT2, and the first and second connection patterns CT1 and CT2 may include a plurality of first mesh lines MSL1 extending in a first diagonal direction DDR1 and a plurality of second mesh lines MSL2 extending in a second diagonal direction DDR2.

The first diagonal direction DDR1 may intersect the first and second directions DR1 and DR2 in a plane defined by the first and second directions DR1 and DR2. The second diagonal direction DDR2 may be substantially orthogonal to the first diagonal direction DDR1 in a plane defined by the first and second directions DR1 and DR2.

The first mesh lines MSL1 and the second mesh lines MSL2 may be integrally formed. Mesh openings MOP may be defined by the first mesh lines MSL1 and the second mesh lines MSL2 integrally formed. The pixels PX illustrated in FIG. 5 may be arranged to overlap the mesh openings MOP. The first and second mesh lines MSL1 and MSL2 may be disconnected and spaced apart from each other at the boundaries BAL1, BAL2, and BAL3 shown by the thick lines. Therefore, the first and second connection patterns CT1 and CT2 may be disconnected and spaced apart from the first sensors SP1. As a result, the first and second connection patterns CT1 and CT2 may be insulated from the first sensors SPL.

The first connection line CNL1 and the second connection line CNL2 may extend along the first and second mesh lines MSL1 and MSL2 in the active area AA. The first connection line CNL1 may be connected to at least one intersection of intersections of the first mesh lines MSL1 and the second mesh lines MSL2. The second connection line CNL2 may extend from some of first and second mesh lines MSL1 and MSL2 of the second connection pattern CT2.

The connection parts CP may extend along the first and second mesh lines MSL1 and MSL2 in the active area AA. The connection parts CP may be connected to at least one intersection of the intersections of the first mesh lines MSL1 and the second mesh lines MSL2. Parts indicated by dots represent parts of the connection parts CP connected to the at least one intersection of the intersections of the first mesh lines MSL1 and the second mesh lines MSL2 and a part of the first connection line CNL1 connected thereto.

Each of the connection parts CP may extend in at least one line in the hole area HA. Although each of the connection parts CP extends, by way of example, in two lines in the hole area HA, the number of lines extending may not be limited thereto.

Figure 16:
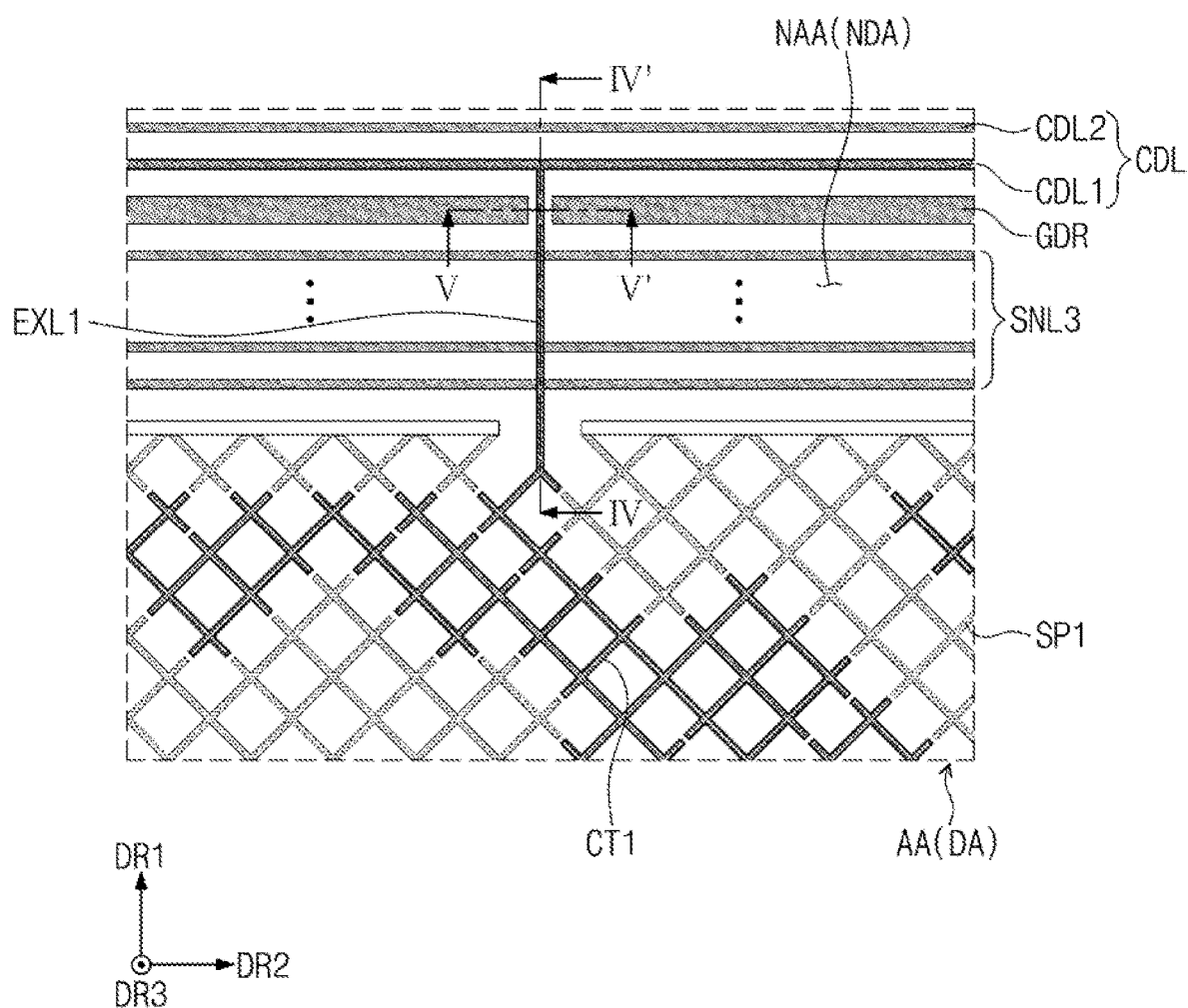
FIG. 16 is an enlarged view of the first connection pattern, the first extension line, and the first crack detection line illustrated in FIG. 9 according to an exemplary embodiment of the present inventive concept.
Figure 17:
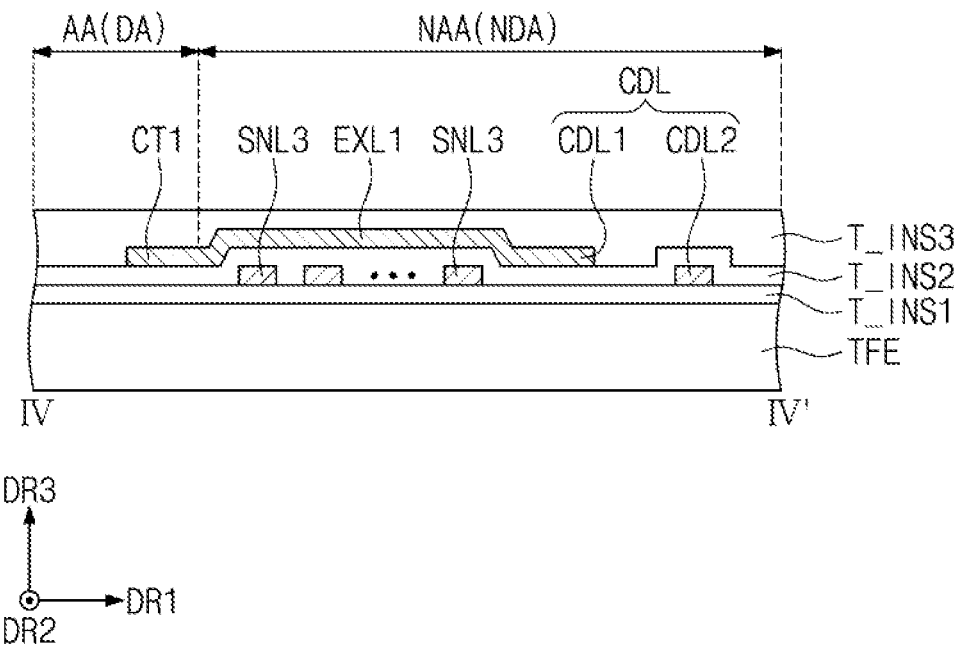
FIG. 17 is a cross-sectional view taken along line IV-IV' illustrated in FIG. 16 according to an exemplary embodiment of the present inventive concept.
Figure 18:
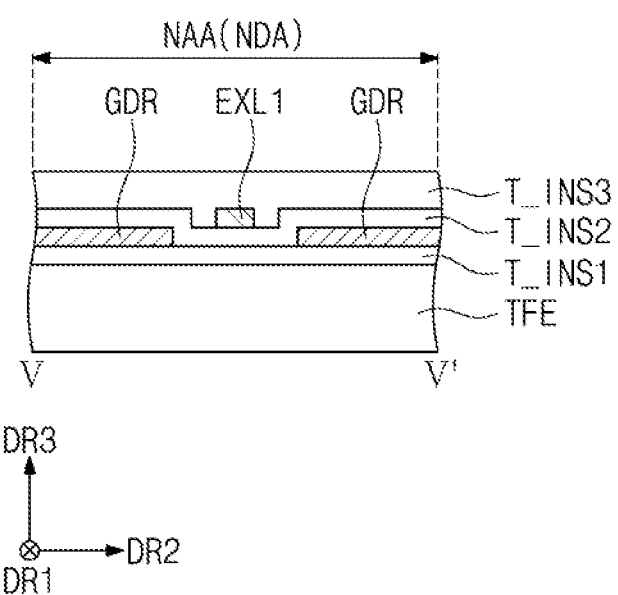
FIG. 18 is a cross-sectional view taken along line V-V' illustrated in FIG. 16 according to an exemplary embodiment of the present inventive concept.

FIG. 16 is an enlarged view of the first connection pattern, the first extension line, and the first crack detection line illustrated in FIG. 9. FIG. 17 is a cross-sectional view taken along line IV-IV illustrated in FIG. 16. FIG. 18 is a cross-sectional view taken along line V-V illustrated in FIG. 16.

By way of example, the first connection pattern CT1 is illustrated in a mesh shape in FIG. 16, and the elements below the thin film encapsulation layer TFE are omitted in FIGS. 17 and 18.

Referring to FIGS. 16 and 17, the first extension line EXL1 extending from the first connection pattern CT1 may be disposed on the second insulating layer T_INS2 to extend to the non-active area NAA (or the non-display area NDA). The first crack detection line CDL1 may be disposed on the second insulating layer T_INS2 and may extend from the first extension line EXL1. That is, the first connection pattern CT1, the first extension line EXL1, and the first crack detection line CDL1 may be integrally formed.

The third sensing lines SNL3 and the second crack detection line CDL2 may be disposed on the first insulating layer T_INS1. The second insulating layer T_INS2 may be disposed on the first insulating layer T_INS1 to cover the third sensing lines SNL3 and the second crack detection line CDL2.

The first extension line EXL1 may extend to intersect the third sensing lines SNL3. The first extension line EXL1 may be insulated from the third sensing lines SNL3 by the second insulating layer T_INS2. The third insulating layer T_INS3 may be disposed on the second insulating layer T_INS2 to cover the first extension line EXL1 and the first crack detection line CDL1.

Referring to FIGS. 16 and 18, a guard ring line GDR may be disposed in the non-active area NAA (or the non-display area NDA). The guard ring line GDR may be disposed between the first and second crack detection lines CDL1 and CDL2 and the non-active area NAA (or the non-display area NDA). The guard ring line GDR may be disposed between the first and second crack detection lines CDL1 and CDL2 and the third sensing lines SNL3.

The guard ring line GDR may be disposed on the first insulating layer T_INS1, and the second insulating layer T_INS2 may be disposed on the first insulating layer T_INS1 to cover the guard ring line GDR. The guard ring line GDR may be disposed in the same layer as the second connection pattern CT2. The guard ring line GDR may include a conductive material.

The guard ring line GDR may serve to block static electricity introduced from the outside from being transmitted to the sensing electrodes SE1 and SE2. The width of the guard ring line GDR may be greater than the width of each of the third sensing lines SNL3 and the first and second crack detection lines CDL1 and CDL2.

The guard ring line GDR may not overlap the first extension line EXL1 of the crack detection part CDT. When viewed in a plane, for example, the guard ring line GDR may not be disposed in an area in which the guard ring line GDR intersects the first extension line EXL1. The guard ring line GDR may be spaced apart from the first extension line EXL1.

When the guard ring line GDR is disposed below the first extension line EXL1 to overlap the first extension line EXL1, the first extension line EXL1 and the guard ring line GDR may short-circuit through the second insulating layer T_INS2 in a manufacturing process. In an embodiment of the inventive concept, because the guard ring line GDR is spaced apart from and does not overlap the first extension line EXL1, a short circuit of the first extension line EXL1 and the guard ring line GDR may be prevented in the manufacturing process.

Figure 19:
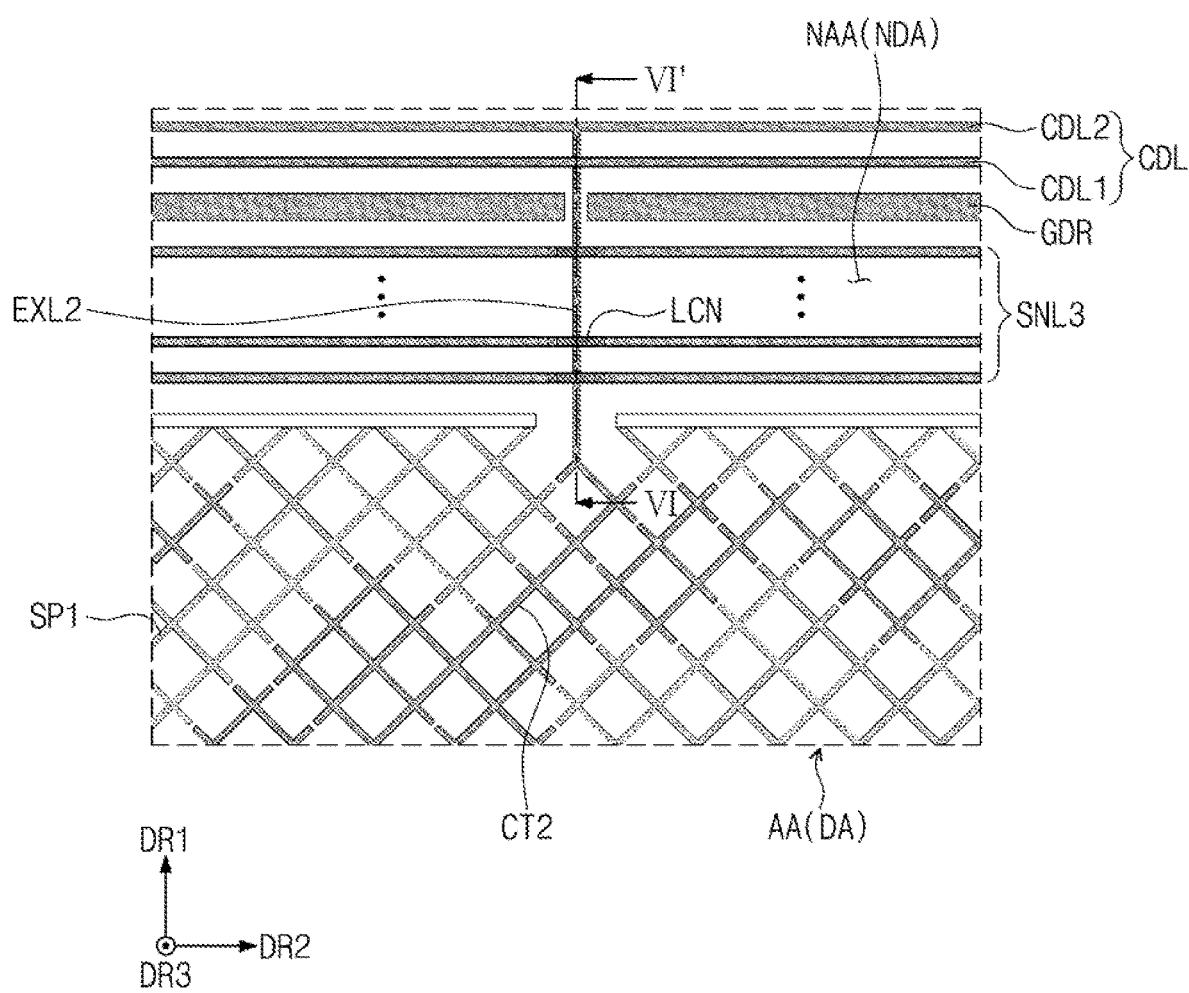
FIG. 19 is an enlarged view of the second connection pattern, the second extension line, and the second crack detection line illustrated in FIG. 9 according to an exemplary embodiment of the present inventive concept.
Figure 20:
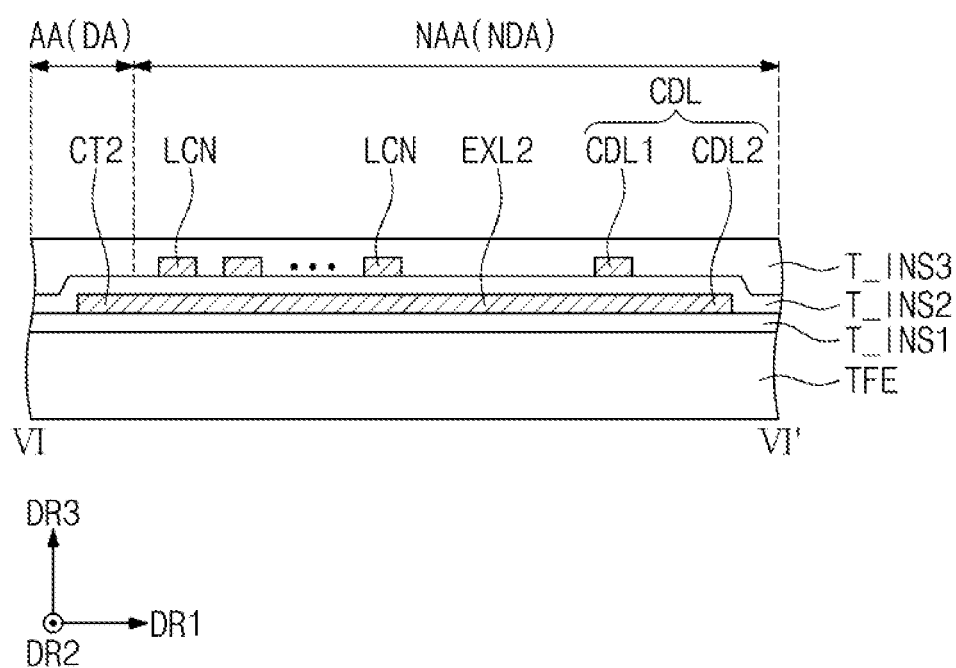
FIG. 20 is a cross-sectional view taken along line VI-VI' illustrated in FIG. 19 according to an exemplary embodiment of the present inventive concept.

FIG. 19 is an enlarged view of the second connection pattern, the second extension line, and the second crack detection line illustrated in FIG. 9. FIG. 20 is a cross-sectional view taken along line VI-VI' illustrated in FIG. 19.

By way of example, the second connection pattern CT2 is illustrated in a mesh shape in FIG. 19, and the elements below the thin film encapsulation layer TFE are omitted in FIG. 20.

Referring to FIGS. 19 and 20, the second extension line EXL2 extending from the second connection pattern CT2 may be disposed on the first insulating layer T_INS1 to extend to the non-active area NAA (or the non-display area NDA). The second crack detection line CDL2 may be disposed on the first insulating layer T_INS1 to extend from the second extension line EXL2. That is, the second connection pattern CT2, the second extension line EXL2, and the second crack detection line CDL2 may be integrally formed.

The second extension line EXL2 may extend to intersect the third sensing lines SNL3. In an area in which the third sensing lines SNL3 overlap the second extension line EXL2, the third sensing lines SNL3 may be connected through line connectors LCN. The line connectors LCN may be disposed on the second insulating layer T_INS2.

Although contact holes defined in the second insulating layer T_INS2 are not illustrated, the line connectors LCN may be connected to the third sensing lines SNL3 through the contact holes. The third insulating layer T_INS3 may be disposed on the second insulating layer T_INS2 to cover the line connectors LCN.

The guard ring line GDR may not overlap the second extension line EXL2 of the crack detection part CDT. When viewed in a plane, for example, the guard ring line GDR may not be disposed in an area in which the guard ring line GDR intersects the second extension line EXL2. The guard ring line GDR may be spaced apart from the second extension line EXL2.

Figure 21:
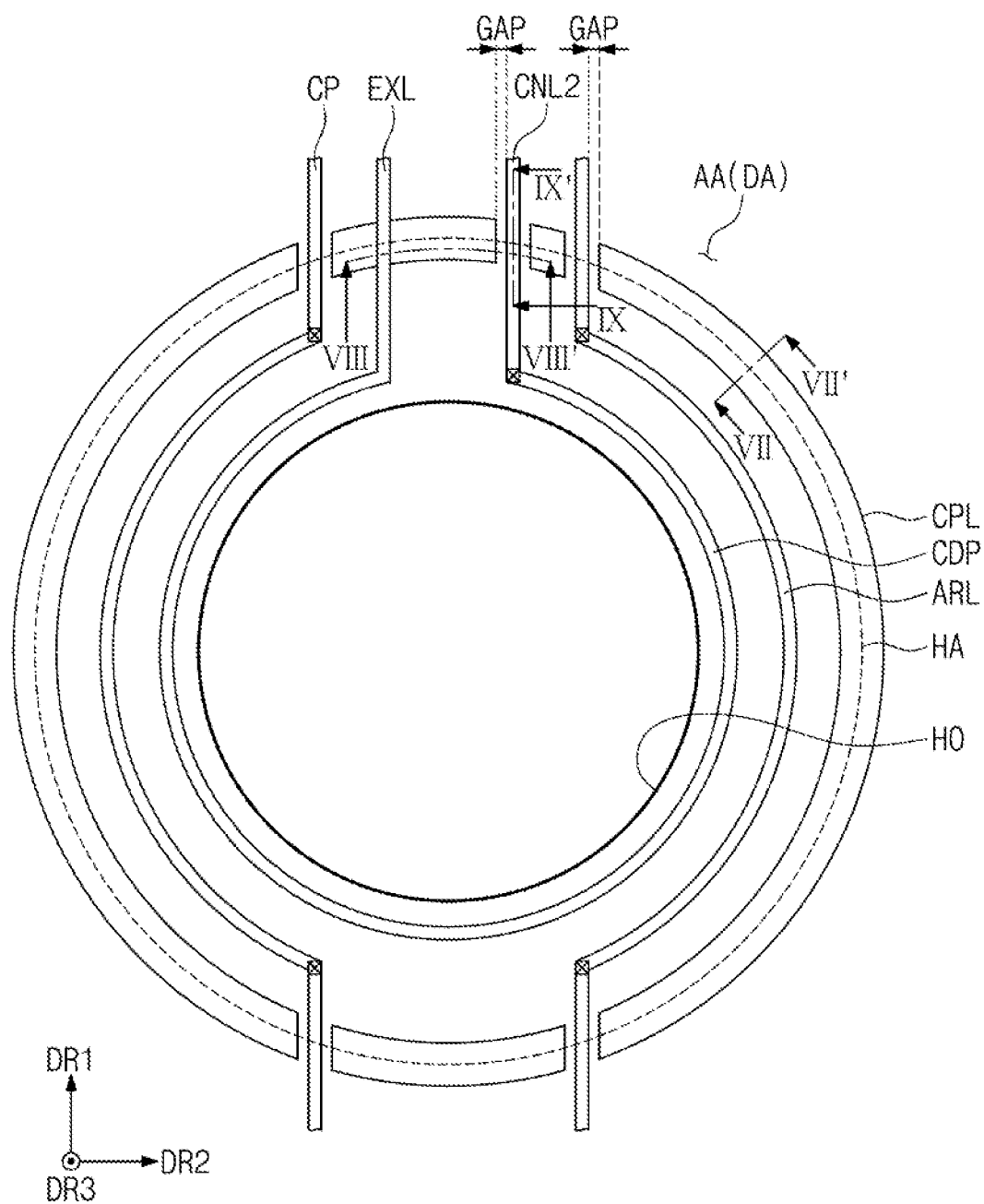
FIG. 21 is an enlarged view of the hole area illustrated in FIG. 9 according to an exemplary embodiment of the present inventive concept.
Figure 22:
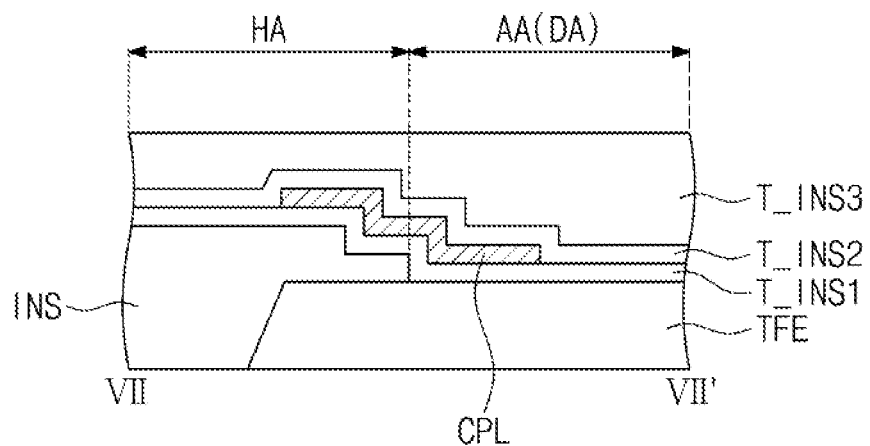
FIG. 22 is a cross-sectional view taken along line VII-VII' illustrated in FIG. 21 according to an exemplary embodiment of the present inventive concept.
Figure 23:
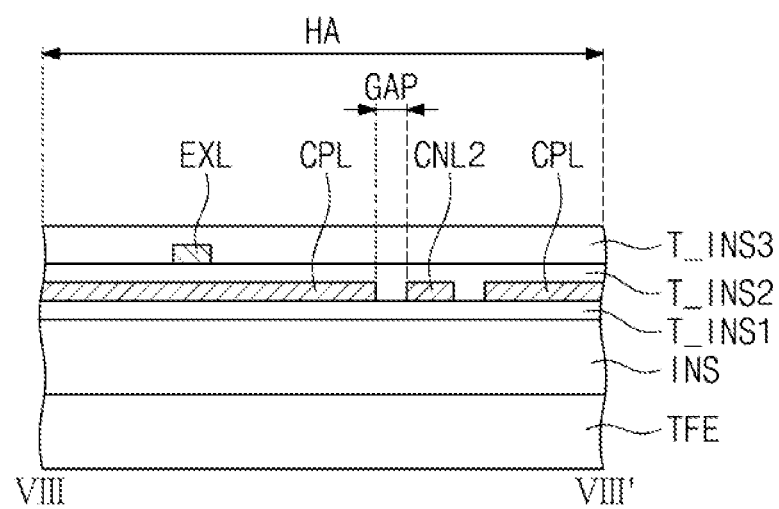
FIG. 23 is a cross-sectional view taken along line VIII-VIII' illustrated in FIG. 21 according to an exemplary embodiment of the present inventive concept.
Figure 24:
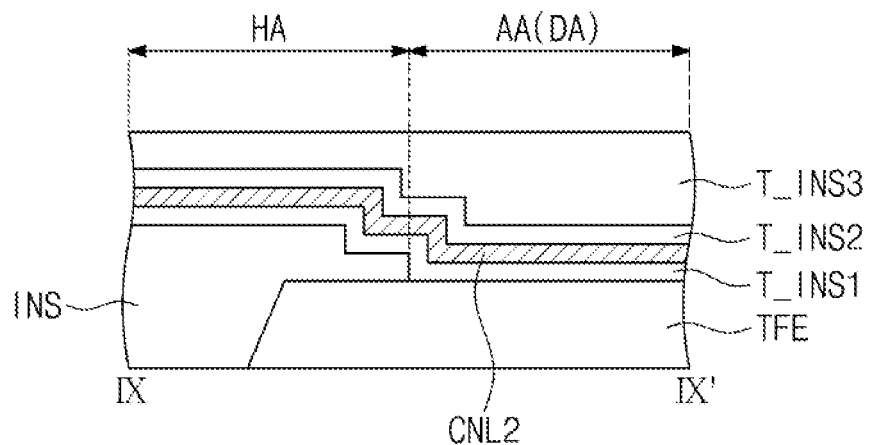
FIG. 24 is a cross-sectional view taken along line IX-IX' illustrated in FIG. 21 according to an exemplary embodiment of the present inventive concept.

FIG. 21 is an enlarged view of the hole area illustrated in FIG. 9. FIG. 22 is a cross-sectional view taken along line VII-VII' illustrated in FIG. 21. FIG. 23 is a cross-sectional view taken along line VIII-VIII' illustrated in FIG. 21. FIG. 24 is a cross-sectional view taken along line IX-IX' illustrated in FIG. 21.

By way of example, the elements below the thin film encapsulation layer TFE are omitted in FIGS. 22 to 24.

Referring to FIGS. 21 and 22, a capping layer CPL may be disposed at a boundary between the active area AA (or the display area DA) and the hole area HA. The capping layer CPL may be spaced apart from the crack detection pattern CDP and may be disposed on the insulating layer INS to cover the edge of the insulating layer INS having a step structure of at least two steps. The capping layer CPL may include a conductive material.

The capping layer CPL may be disposed on a portion of the insulating layer INS adjacent to the boundary of the hole area HA and a portion of the thin film encapsulation layer TFE adjacent to the boundary of the hole area HA. The capping layer CPL may be disposed more outward than the bypass line ARL.

Referring to FIGS. 21, 22, and 23, the capping layer CPL may be disposed on the first insulating layer T_INS1. The capping layer CPL may be disposed in the same layer as the second connection line CNL2. That is, the capping layer CPL may be disposed in the same layer as the second connection pattern CT2. Although the connection part CP is not illustrated, the capping layer CPL and the connection part CP may be disposed in the same layer. The second insulating layer T_INS2 may be disposed on the first insulating layer T_INS1 to cover the capping layer CPL. The extension line EXL may be disposed on the capping layer CPL.

Referring to FIGS. 21 and 23, the capping layer CPL may not overlap the second connection line CNL2 and may be disposed in the same layer as the second connection line CNL2. The capping layer CPL may be spaced apart from the second connection line CNL2 by a gap GAP greater than zero and less than about 15 micrometers. Similarly, the capping layer CPL may not overlap the connection part CP passing through the boundary of the hole area HA. The capping layer CPL may be spaced apart from the connection part CP by a gap GAP greater than zero and less than about 15 micrometers.

Referring to FIG. 24, the second connection line CNL2 may extend over the edge of the insulating layer INS formed as the step structure of at least two steps.

FIGS. 25 to 30 are views for describing a method of manufacturing the capping layer and the second connection line illustrated in FIG. 21.

Figure 25:
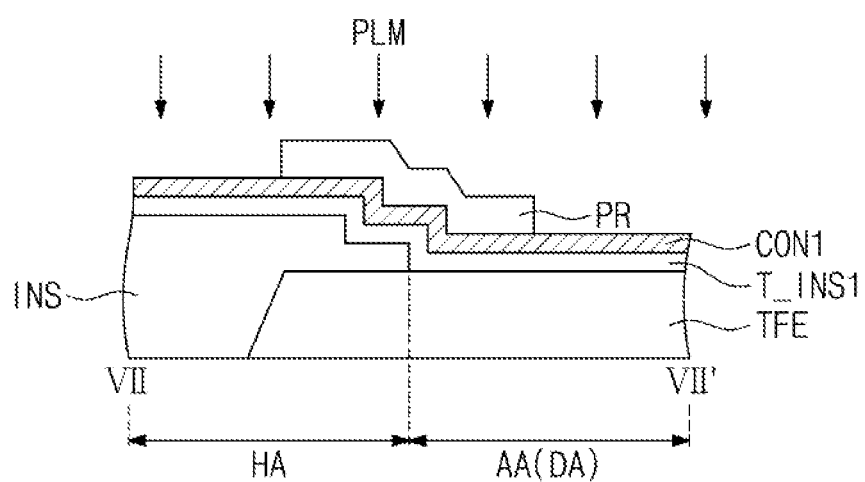
FIGS. 25 to 30 are views for describing a method of manufacturing the capping layer and the second connection line illustrated in FIG. 21 according to an exemplary embodiment of the present inventive concept.
Figure 26:
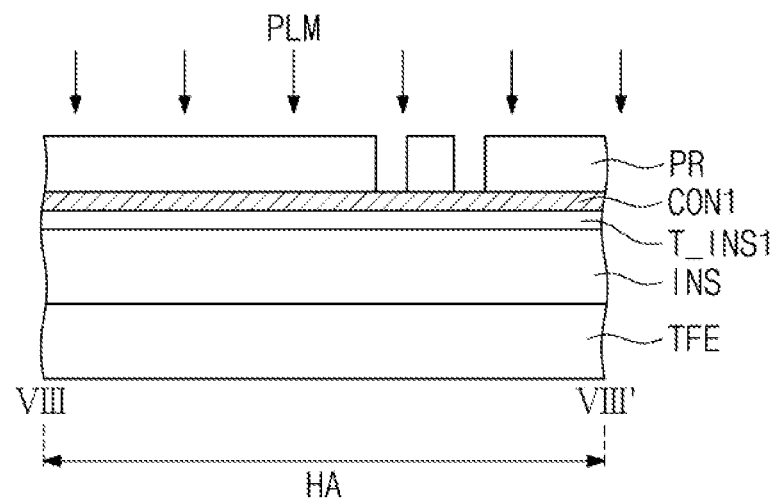
Figure 27:
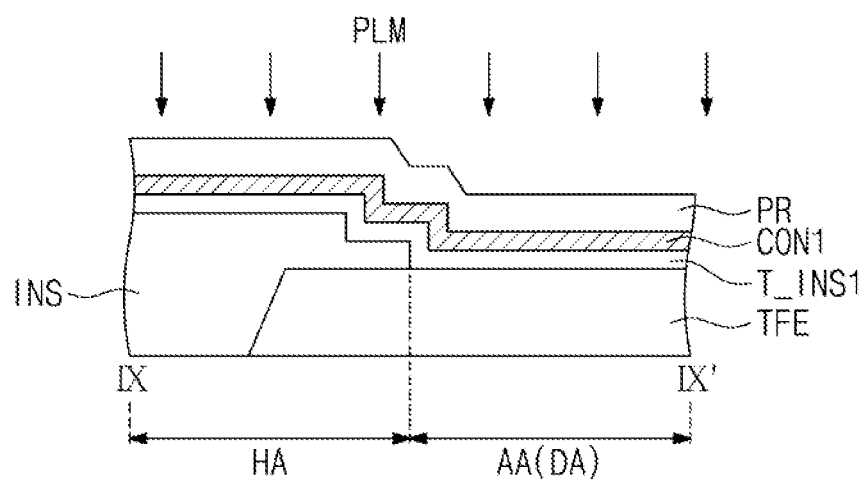
Figure 28:
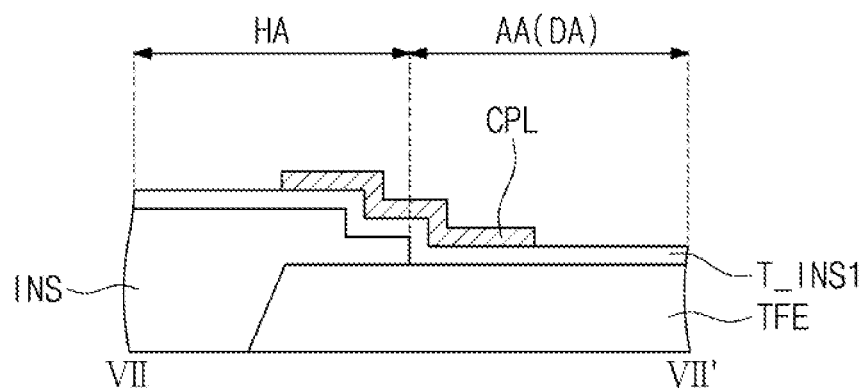
Figure 29:
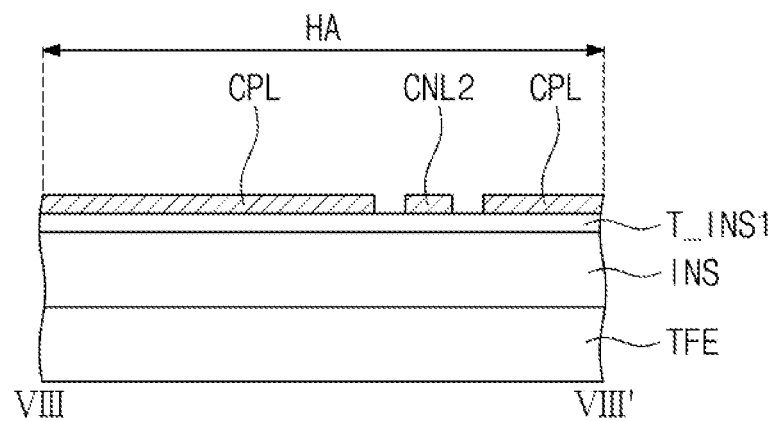
Figure 30:
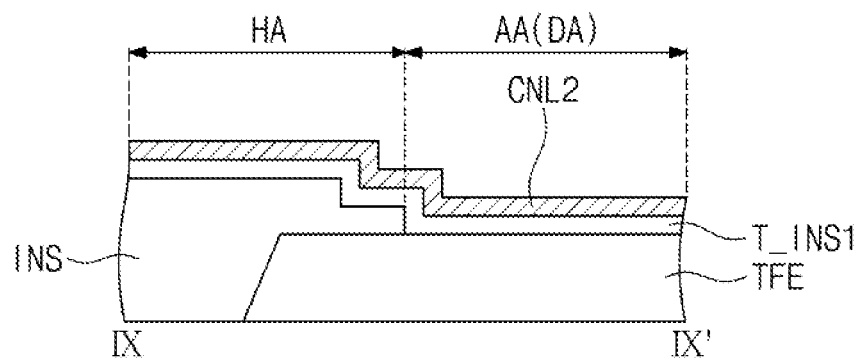

By way of example, FIGS. 25 and 28 illustrate cross sections corresponding to the illustration of FIG. 22, and FIGS. 26 and 29 illustrate cross sections corresponding to the illustration of FIG. 23. In addition, FIGS. 27 and 30 illustrate cross sections corresponding to the illustration of FIG. 24.

Referring to FIGS. 25, 26, and 27, a first conductive layer CON1 may be disposed on a first insulating layer T_INS1. The first conductive layer CON1 may be provided on the first insulating layer T_INS1 to form a capping layer CPL and a second connection line CNL2. Although not illustrated, a connection part CP may be formed from the first conductive layer CON1.

A photoresist PR may be disposed on the first conductive layer CON1. The photoresist PR may be disposed on an area where the capping layer CPL will be formed and an area where the second connection line CNL2 will be formed. Although not illustrated, the photoresist PR may be disposed on an area where the connection part CP will be formed.

The photoresist PR may serve as a mask. A portion of plasma PLM, which is used in a dry etching process, may be provided to a portion of the first conductive layer CON1 which is not covered by the photoresist PR. Another portion of the plasma PLM provided toward a portion of the first conductive layer CON1 covered by the photoresist PR may be blocked by the photoresist PR.

Referring to FIGS. 28, 29, and 30, the portion of the first conductive layer CON1 which is not covered by the photoresist PR may be removed through the dry etching process. The photoresist PR may be removed after the etching process. Accordingly, the capping layer CPL and the second connection line CNL2 may be formed on the first insulating layer T_INS1. Although not illustrated, the connection part CP may be formed on the first insulating layer T_INS1 by patterning the first conductive layer CON1.

Thereafter, a second insulating layer T_INS2 and a third insulating layer T_INS3 may be sequentially laminated on the capping layer CPL and the second connection line CNL2.

FIGS. 31 to 35 illustrate a method of manufacturing a display device as a comparative method of the present inventive concept.

Figure 31:
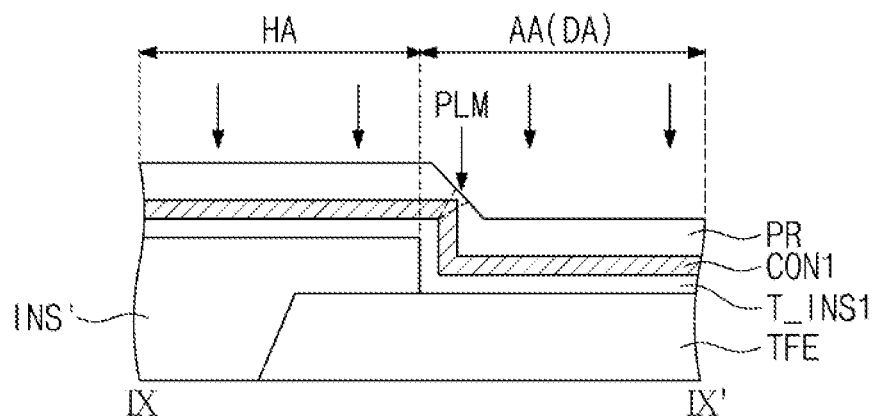
FIGS. 31 to 35 illustrate a method of manufacturing a display device as a comparative method of the present inventive concept.
Figure 32:
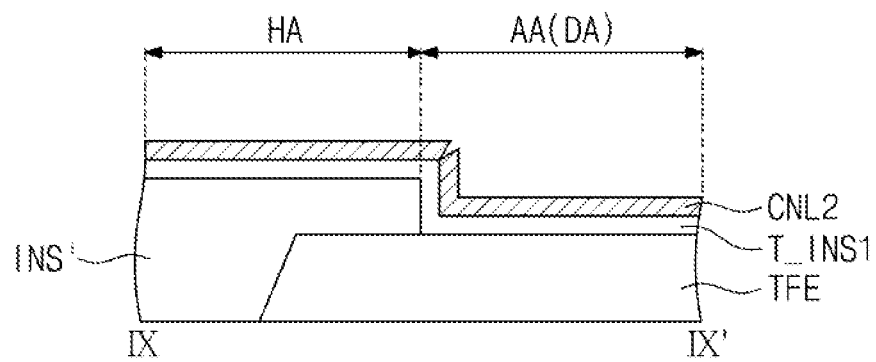

By way of example, FIGS. 31 and 32 illustrate cross sections corresponding to the illustration of FIG. 24, and FIGS. 33 to 35 illustrate cross sections corresponding to the illustration of FIG. 22. FIGS. 31 to 35 will be described along with some of FIGS. 21 to 30 when necessary in the following description.

Figure 33:
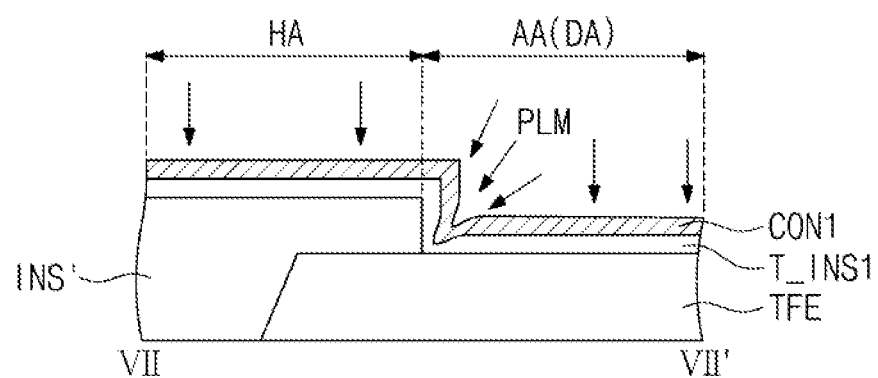
Figure 34:
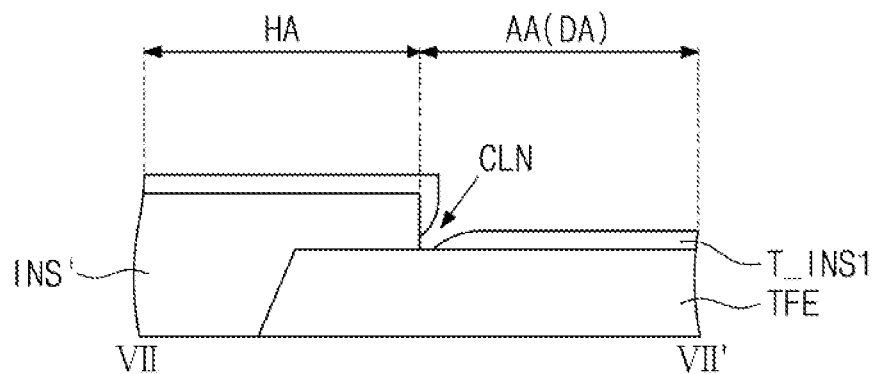
Figure 35:
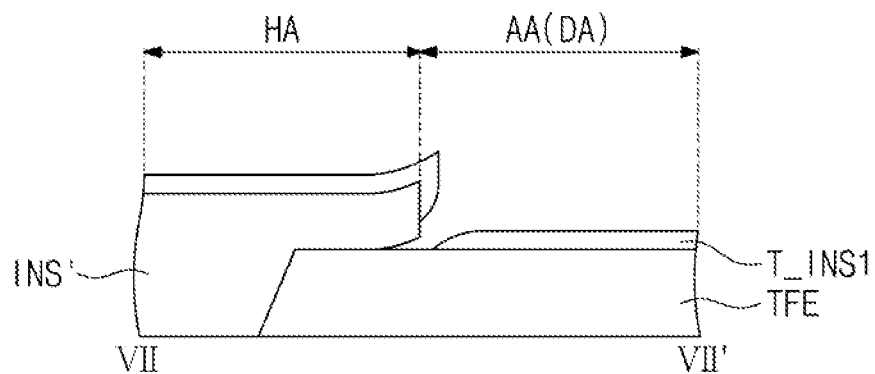

FIGS. 31 and 32 are cross-sectional views corresponding to line IX-IX' of FIG. 21 and are views for describing a method of manufacturing a second connection line CNL2. FIGS. 33 to 35 are cross-sectional views corresponding to line VII-VII' of FIG. 21 when a capping layer CPL is not formed.

Referring to FIGS. 31 and 32, an edge of an insulating layer INS' may have a single step structure. The height of a top surface of the insulating layer INS' may be the same as the height of a top surface of the insulating layer INS illustrated in FIG. 24.

A first conductive layer CON1 for forming the second connection line CNL2 may be provided on a first insulating layer T_INS1. A photoresist PR may be disposed on the first conductive layer CON1. The photoresist PR may be disposed on an area where the second connection line CNL2 will be formed.

The photoresist PR, which may have fluidity, may be disposed thinner at an edge of an upper end of the insulating layer INS' than on the periphery of the edge. The larger the step of the edge of the insulating layer INS', the thinner a portion of the photoresist PR disposed at the edge of the upper end of the insulating layer INS' may be.

In a dry etching process, the photoresist PR may be damaged by plasma PLM. In the case that the photoresist PR is sufficiently thick, the first conductive layer CON1 may not be exposed even when the photoresist PR is damaged. When the photoresist PR is thin, however, the photoresist PR may be damaged by the plasma PLM, and the first conductive layer CON1 may be exposed.

Accordingly, a portion of the first conductive layer CON1 may be removed undesirably. For example, a portion of the photoresist PR disposed on the edge of the upper end of the insulating layer INS' is damaged, and thus a portion of the first conductive layer CON1 disposed on the edge of the upper end of the insulating layer INS' may be removed. In this case, as illustrated in FIG. 32, the second connection line CNL2 formed on the insulating layer INS' may be broken on the edge of the upper end of the insulating layer INS'. That is, a crack detection part CDT may be damaged in the manufacturing process.

Although the second connection line CNL2 has been described by way of example, the problem described above may also occur in connection parts CP and extension line EXL extending via the single step of the insulating layer INS'.

The thickness of the photoresist PR on the edge of the insulating layer INS having a step structure of at least two steps as illustrated in FIG. 27 may be greater than the thickness of the photoresist PR on the edge of the insulating layer INS' having a step structure of a single step as illustrated in FIG. 31. The photoresist PR illustrated in FIG. 27 may have a thickness sufficient to protect the first conductive layer CON1 from the plasma PLM in the manufacturing process.

Accordingly, as illustrated in FIG. 30, the second connection line CNL2 formed from the first conductive layer CON1 may not be broken on the edge of the upper end of the insulating layer INS. In other words, damage to the crack detection part CDT may be prevented.

Referring to FIGS. 22 and 25, because the photoresist PR is provided on an area where the capping layer CPL is formed, the first conductive layer CON1 from which the capping layer CPL is formed may be protected. However, the photoresist PR may not be used in FIG. 25 when the capping layer CPL is not formed.

Referring to FIG. 33, when the capping layer CPL is not formed on the first insulating layer T_INS1, the first conductive layer CON1 may be exposed because the photoresist PR is not used. The first conductive layer CON1 may be removed by the plasma PLM in the manufacturing process.

When the edge of the insulating layer INS' has a single step, the first insulating layer T_INS1 and the first conductive layer CON1 may have smaller thicknesses at a lower end of the edge of the insulating layer INS' than on the periphery of the edge of the insulating layer INS'. For example, during a deposition process for forming the first insulating layer T_INS1 and the first conductive layer CON1, a deposition material may not be sufficiently provided to the lower end of the edge of the insulating layer INS'.

Referring to FIGS. 33 and 34, a portion of the first insulating layer T_INS1 and a portion of the first conductive layer CON1 provided to the lower end of the edge of the insulating layer INS' may be damaged by the plasma PLM provided in various directions. Accordingly, as illustrated in FIG. 34, the lower end of the edge of the insulating layer INS' may be exposed. In a cleaning process, a cleaning liquid CLN may be provided to the lower end of the edge of the insulating layer INS'.

Referring to FIG. 35, during the cleaning process, the lower end of the edge of the insulating layer INS' may be peeled off by the cleaning liquid CLN provided to the lower end of the edge of the insulating layer INS'. As a result, a defective display device may be manufactured.

Referring to FIG. 25, the photoresist PR may be disposed on a portion of the first conductive layer CON1 from which the capping layer CPL is formed. A portion of the first insulating layer T_INS1 and a portion of the first conductive layer CON1 provided to a lower end of the edge of the insulating layer INS may be protected by the photoresist PR and thus may not be damaged by the plasma PLM in the manufacturing process.

Referring to FIG. 28, because the capping layer CPL is formed on the insulating layer INS to cover the edge of the insulating layer INS, the cleaning liquid CLN may be blocked by the capping layer CPL during a cleaning process. Accordingly, the lower end of the edge of the insulating layer INS may not be peeled off.

According to an embodiment of the inventive concept, defects in the display device DD may be reduced, and reliability of the display device DD may be increased.

According to an embodiment of the inventive concept, whether the display device is cracked may be easily detected by disposing the crack detection part in the display device.

In addition, the edge of the insulating layer where the crack detection part is disposed is formed as the step structure of at least two steps, and thus damage to the crack detection part may be prevented.

Furthermore, because the capping layer is disposed to cover the edge of the insulating layer disposed in the hole area, peeling of the edge of the insulating layer may be prevented.

Although the exemplary embodiments of the inventive concept have been described herein, it is understood that various changes and modifications may be made by those skilled in the art within the spirit and scope of the inventive concept defined by the following claims or the equivalents. The exemplary embodiments described herein are not intended to limit the technical spirit and scope of the present invention, and all technical spirit within the scope of the following claims or the equivalents will be construed as being included in the scope of the present invention.

What is claimed is:

1. A display device comprising:
    a display panel including a hole area, a display area around the hole area, and a non-display area around the display area;
    a first-first insulating layer disposed in the hole area;
    a plurality of sensing electrodes disposed on the display area;
    a crack detection pattern disposed on the first-first insulating layer in the hole area;
    a crack detection line disposed on the non-display area; and
    a connection pattern disposed in a first sensing electrode of the plurality of sensing electrodes disposed on the display area to be insulated from the plurality of sensing electrodes, and connected to the crack detection pattern and the crack detection line,
    wherein the first sensing electrode is disposed between the hole area and the non-display area, wherein an edge of the first-first insulating layer disposed at a boundary between the display area and the hole area has a step structure of at least two steps, wherein the first sensing electrode include an inner portion, an outer portion, and an opening therebetween, and wherein the connection pattern is disposed in the opening and between the inner portion and the outer portion.

2. The display device of claim 1, wherein the crack detection pattern comprises a first end and a second end and surrounds a hole defined in the hole area, and wherein the hole penetrates the first-first insulating layer.

3. The display device of claim 2, wherein the connection pattern comprises:

a first connection pattern disposed in the same layer as the crack detection pattern, and connected to the first end of the crack detection pattern; and a second connection pattern disposed in a layer different from a layer of the crack detection pattern, and connected to the second end of the crack detection pattern, and wherein the crack detection line comprises:

a first crack detection line connected to the first connection pattern; and a second crack detection line connected to the second connection pattern.

4. The display device of claim 3, further comprising:

a capping layer spaced apart from the crack detection pattern and disposed on the first-first insulating layer to cover the edge of the first-first insulating layer.

5. The display device of claim 4, wherein the capping layer comprises a conductive material.

6. The display device of claim 4, wherein the capping layer is disposed in the same layer as the second connection pattern.

7. The display device of claim 4, further comprising:

an extension line extending from the first end of the crack detection pattern over the step structure of the hole area toward the first connection pattern;

a first connection line disposed in the same layer as the second connection pattern, and configured to connect the first connection pattern and the extension line to each other; and a second connection line which extends from the second connection pattern over the step structure of the hole area to the hole area and is connected to the second end of the crack detection pattern.

8. The display device of claim 7, wherein the capping layer is disposed in the same layer as the second connection line and is spaced apart from the second connection line.

9. The display device of claim 8, wherein the capping layer is spaced apart from the second connection line by a gap which is greater than zero and less than about 15 micrometers.

10. The display device of claim 7, wherein the plurality of sensing electrodes comprise:

a plurality of first sensing electrode patterns spaced apart from each other in a first direction;

a plurality of first dummy patterns disposed in a plurality of first openings defined in each of the plurality of first sensing electrode patterns;

a plurality of connection parts disposed between the plurality of first sensing electrode patterns such that each of the plurality of connection parts connects two adjacent first sensing electrode patterns of the plurality of first sensing electrode patterns to each other;

a plurality of second sensing electrode patterns spaced apart from each other in a second direction intersecting the first direction; and a plurality of branch parts which are integrally formed with the plurality of second sensing electrode patterns, wherein each of the plurality of branch parts connects two adjacent second sensing electrode patterns of the plurality of second sensing electrode patterns to each other, wherein the plurality of branch parts are insulated from the plurality of connection parts, and each of the plurality of branch parts extends to intersect a corresponding one of the plurality of connection parts, and wherein the first sensing electrode corresponds to one of the plurality of first sensing electrode patterns.

11. The display device of claim 10, further comprising:

a plurality of second dummy patterns disposed in a plurality of second openings defined in each of the plurality of second sensing electrode patterns other the one of the plurality of second sensing electrode patterns.

12. The display device of claim 10, wherein the first connection line and the second connection line are insulated from a first branch part among the plurality of branch parts, wherein the first branch part of the plurality of branch parts is disposed between the hole area and the non-display area, and wherein each of the first connection line and the second connection line extends to intersect the first branch part among the plurality of branch parts.

13. The display device of claim 10, wherein the plurality of first sensing electrode patterns, the plurality of branch parts, and the plurality of second sensing electrode patterns are disposed in the same layer as the crack detection pattern, and wherein the plurality of connection parts are disposed in the same layer as the second connection pattern.

14. The display device of claim 10, wherein a first sub opening and a second sub opening are defined in the one of the plurality of first sensing electrode patterns and are opened toward the non-display area, and wherein the first connection pattern and the second connection pattern are respectively disposed in the first sub opening and the second sub opening.

15. The display device of claim 10, further comprising:

a first insulating layer disposed on the display area to extend over the first-first insulating layer; and a second insulating layer disposed on the first insulating layer, wherein the crack detection pattern is disposed on the second insulating layer, the second connection pattern is disposed on the first insulating layer, and the second insulating layer is disposed on the first insulating layer to cover the second connection pattern.

16. The display device of claim 3, further comprising:

a guard ring line disposed between the first and second crack detection lines, and the display area, wherein the guard ring line is disposed in the same layer as the second connection pattern.

17. The display device of claim 16, further comprising:

a first extension line which extends from the first connection pattern to the first crack detection line and is disposed on the non-display area; and a second extension line which extends from the second connection pattern to the second crack detection line and is disposed on the non-display area, wherein the guard ring line does not overlap the first extension line and the second extension line.

18. The display device of claim 1, wherein the crack detection pattern, the crack detection line, and the connection pattern comprise a conductive material.

19. A display device comprising:

a display panel including a first area, a second area around the first area, and a third area around the second area;

an insulating layer disposed in the first area and including an inner edge and a stepped outer edge;

a hole penetrating the insulating layer and defining the inner edge of the insulating layer, wherein the stepped outer edge is disposed at an outer boundary of the insulating layer;

a plurality of sensing electrodes disposed on the second area; and a crack detection part which is disposed on the insulating layer in the first area, is insulated from the plurality of sensing electrodes, and extends to the second area and the third area, wherein the stepped outer edge of the insulating layer disposed at a boundary between the first area and the second area has a step structure of at least two steps, and wherein the crack detection part is disposed over the stepped outer edge of the insulating layer and extends from the first area toward the second area.

20. The display device of claim 19, further comprising:

a capping layer disposed on the insulating layer to cover the stepped outer edge of the insulating layer.

21. The display device of claim 19, further comprising:

a guard ring line disposed on the third area, wherein the guard ring line does not overlap the crack detection part.

22. A display device comprising:

a display panel including a first area, a second area around the first area, and a third area around the second area;

an insulating layer disposed in the first area;

a hole penetrating the insulating layer and defining an inner edge of the insulating layer, wherein the insulating layer includes a flat upper surface and a stepped outer edge, the flat upper surface extending from the inner edge of the insulating layer to the stepped outer edge thereof;

a plurality of sensing electrodes disposed on the second area;

a crack detection pattern disposed on the insulating layer in the first area;

a crack detection line disposed on the third area;

a connection pattern disposed in a first sensing electrode of the plurality of sensing electrodes disposed on the second area to be insulated from the plurality of sensing electrodes, and configured to connect the crack detection pattern and the crack detection line, wherein the first sensing electrode is disposed between the first area and the third area; and a capping layer disposed on the insulating layer to cover the stepped outer edge distant from the hole, of the insulating layer, wherein an outer side surface, at the stepped outer edge, of the insulating layer is lined with the capping layer.

\* \* \* \* \*